(12) United States Patent
More

(10) Patent No.: US 12,062,580 B2
(45) Date of Patent: Aug. 13, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventor: Shahaji B. More, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/991,735

(22) Filed: Nov. 21, 2022

(65) Prior Publication Data

US 2023/0087935 A1 Mar. 23, 2023

Related U.S. Application Data

(63) Continuation of application No. 17/150,337, filed on Jan. 15, 2021, now Pat. No. 11,508,621.
(Continued)

(51) Int. Cl.
*H01L 21/8238* (2006.01)
*H01L 21/8234* (2006.01)
(Continued)

(52) U.S. Cl.
CPC ......... *H01L 21/823814* (2013.01); *H01L 21/823418* (2013.01); *H01L 21/823431* (2013.01);
(Continued)

(58) Field of Classification Search
CPC ......... H01L 21/02068; H01L 21/02532; H01L 21/0262; H01L 21/02631;
(Continued)

(56) References Cited

U.S. PATENT DOCUMENTS 8,962,400 B2   2/2015   Tsai et al.
9,093,514 B2   7/2015   Tsai et al.
(Continued)

FOREIGN PATENT DOCUMENTS

TW     201729418 A    8/2017

OTHER PUBLICATIONS

Prosecution file history of U.S. Appl. No. 17/367,869, filed Jul. 6, 2021.
(Continued)

*Primary Examiner* — Cheung Lee
(74) *Attorney, Agent, or Firm* — STUDEBAKER & BRACKET PC

(57) ABSTRACT

A semiconductor device includes semiconductor nanostructures disposed over a substrate, a source/drain epitaxial layer in contact with the semiconductor nanostructures, a gate dielectric layer disposed on and wrapping around each channel region of the semiconductor nanostructures, a gate electrode layer disposed on the gate dielectric layer and wrapping around each channel region, and insulating spacers disposed in spaces, respectively. The spaces are defined by adjacent semiconductor nanostructures, the gate electrode layer and the source/drain region. The source/drain epitaxial layer includes multiple doped SiGe layers having different Ge contents and at least one of the source/drain epitaxial layers is non-doped SiGe or Si.

20 Claims, 20 Drawing Sheets

Related U.S. Application Data

(60) Provisional application No. 63/068,908, filed on Aug. 21, 2020.

(51) Int. Cl.

| | | |
|---|---|---|
| *H01L 29/165* | (2006.01) | |
| *H01L 29/167* | (2006.01) | |
| *H01L 29/66* | (2006.01) | |
| *H01L 29/775* | (2006.01) | |
| *H01L 29/78* | (2006.01) | |
| *H01L 29/786* | (2006.01) | |
| *H01L 21/02* | (2006.01) | |
| *H01L 29/06* | (2006.01) | |
| *H01L 29/423* | (2006.01) | |

(52) U.S. Cl.
CPC .... *H01L 21/823821* (2013.01); *H01L 29/165* (2013.01); *H01L 29/167* (2013.01); *H01L 29/66439* (2013.01); *H01L 29/66742* (2013.01); *H01L 29/66795* (2013.01); *H01L 29/775* (2013.01); *H01L 29/785* (2013.01); *H01L 29/78618* (2013.01); *H01L 21/02068* (2013.01); *H01L 21/02532* (2013.01); *H01L 21/0262* (2013.01); *H01L 21/02631* (2013.01); *H01L 29/0673* (2013.01); *H01L 29/42392* (2013.01); *H01L 29/78696* (2013.01)

(58) Field of Classification Search
CPC ..... H01L 21/823418; H01L 21/823431; H01L 21/823814; H01L 21/823821; H01L 29/0665; H01L 29/0673; H01L 29/0847; H01L 29/165; H01L 29/167; H01L 29/42392; H01L 29/66439; H01L 29/66742; H01L 29/66795; H01L 29/775; H01L 29/785; H01L 29/78618; H01L 29/78696

See application file for complete search history.

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,418,897 B1 | 8/2016 | Ching et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,812,363 B1 | 11/2017 | Liao et al. |
| 9,853,101 B2 | 12/2017 | Peng et al. |
| 9,859,380 B2 | 1/2018 | Lee et al. |
| 9,881,993 B2 | 1/2018 | Ching et al. |
| 10,453,824 B1 | 10/2019 | Mochizuki et al. |
| 2012/0138886 A1 | 6/2012 | Kuhn et al. |
| 2014/0087537 A1 | 3/2014 | Kim et al. |
| 2015/0069328 A1 | 3/2015 | Leobandung |
| 2015/0137237 A1 | 5/2015 | Jacob et al. |
| 2015/0236124 A1 | 8/2015 | Chang et al. |
| 2015/0380313 A1 | 12/2015 | Ching et al. |
| 2016/0087104 A1 | 3/2016 | Lee et al. |
| 2018/0151378 A1 | 5/2018 | Huang et al. |
| 2018/0151706 A1 | 5/2018 | Lin et al. |
| 2018/0151730 A1 | 5/2018 | Ma et al. |
| 2018/0294331 A1 | 10/2018 | Cho et al. |
| 2019/0035691 A1 | 1/2019 | Okuno et al. |
| 2020/0168735 A1 | 5/2020 | Yu et al. |

OTHER PUBLICATIONS

Prosecution file history of U.S. Appl. No. 17/710,592, filed Mar. 31, 2022.

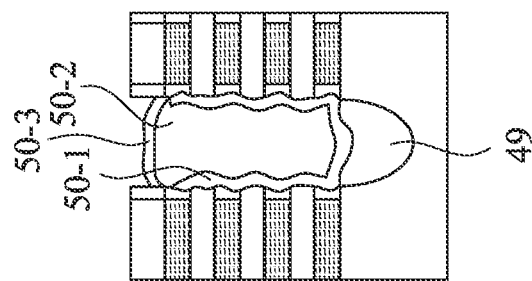
FIG. 19D
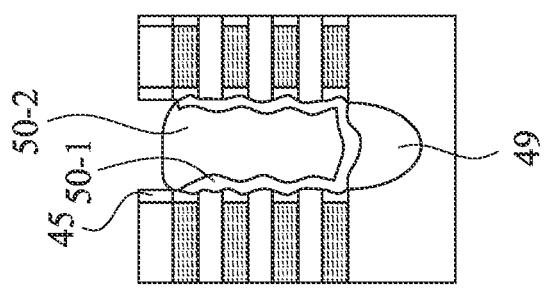
FIG. 19C
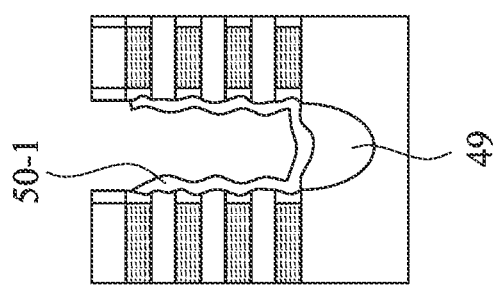
FIG. 19B
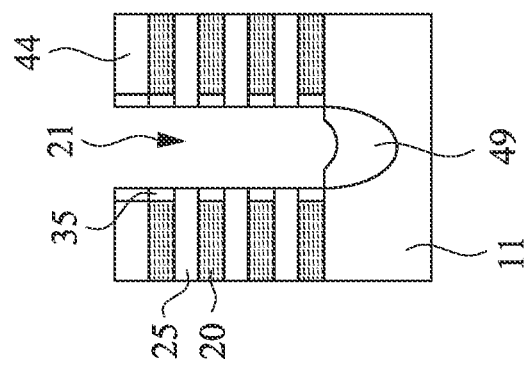
FIG. 19A
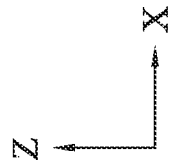

METHOD OF MANUFACTURING A SEMICONDUCTOR DEVICE AND A SEMICONDUCTOR DEVICE

RELATED APPLICATIONS

This application is a continuation of U.S. patent application Ser. No. 17/150,337 filed Jan. 15, 2021, now U.S. Pat. No. 11,508,621, which claims priority to U.S. Provisional Patent Application No. 63/068,908 filed Aug. 21, 2020, the entire content of each of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A

FIGS. 19A, 19B, 19C and 19D show various stages of manufacturing a semiconductor GAA FET device according to an embodiment of the present disclosure.

DETAILED DESCRIPTION

Figure 1A:
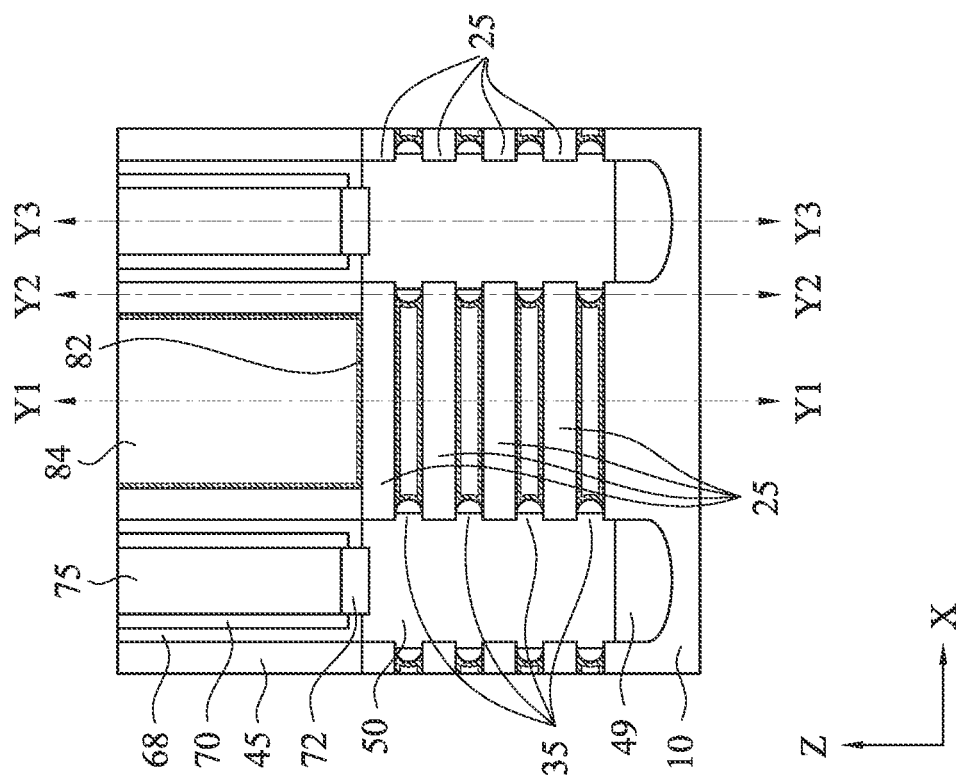
FIGS. 1A-1D show various views of a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanostructures such as nanowires (NWs) and nanosheets, are released by selectively etching sacrificial semiconductor layers. The lateral ends of the NWs may be etched when the NW release etching process is performed after a dummy polysilicon gate is removed, because a lateral etching control or an etching budget for the NW release etch is not sufficient. A gate electrode may touch a source/drain (source/drain) epitaxial layer if there is no etch stop layer. Further, there is a larger impact on gate to drain capacitance (Cgd). If no dielectric film existed between the gate and the source/drain region, Cgd becomes larger, which would reduce circuit speed. Further, in a FinFET or a GAA FET, a source/drain (source/drain) epitaxial layer is required to be defect free. In the present disclosure, a novel method for fabricating a source/drain (source and/or drain) epitaxial layer for a GAA FET and a stacked channel FET are provided. In this disclosure, a source/drain refers to a source and/or a drain. It is noted that in the present disclosure, a source and a drain are interchangeably used and the structures thereof are substantially the same.

Figure 1D:
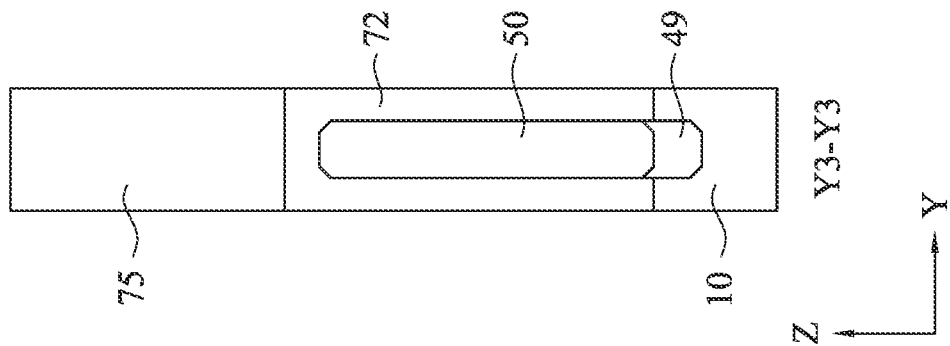
Figure 1C:
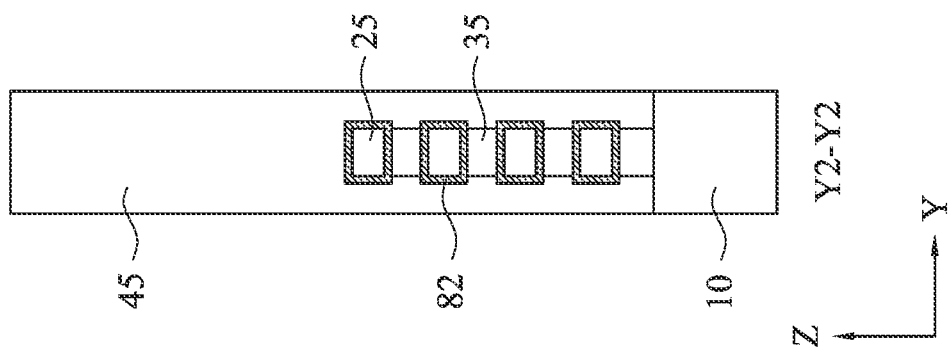
Figure 1B:
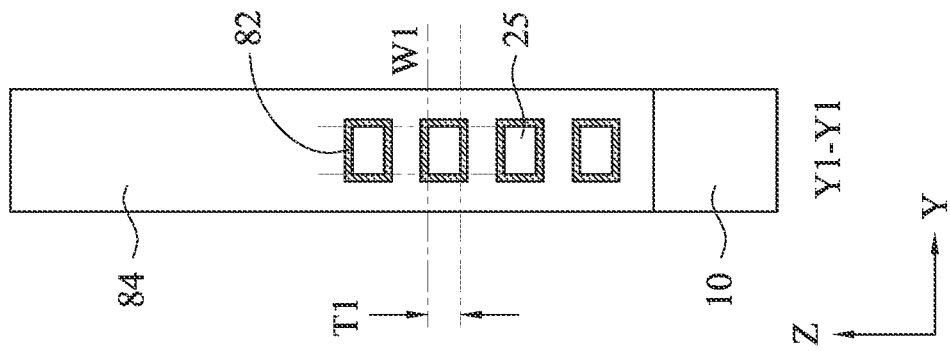

FIGS. 1A-1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the semiconductor GAA FET device of FIGS. 1A-1D is a p-type FET.

As shown in FIGS. 1A-1C, semiconductor nanostructures 25 are provided over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires or sheets (collectively nano-structures) 25, which are channel layers, are disposed over the substrate 10. In some embodiments, the semiconductor nanostructures 25 are disposed over a fin structure 11 (see, FIG. 3) protruding from the substrate 10 (a bottom fin structure 11). Each of the channel layers 25 is wrapped around by a gate dielectric layer 82 and a gate electrode layer 84. The thickness T1 of the semiconductor nanostructures 25 is in a range from about 5 nm to about 60 nm and the width W1 of the semiconductor nanostructures 25 is in a range from about 5 nm to about 120 nm in some embodiments. In some embodiments, the width of the semiconductor wires or sheets is greater than the thickness. In certain embodiments, the width is up to twice or five times the thickness of the semiconductor nanostructures 25. In some embodiments, the semiconductor nanostructures 25 are made of Si, SiGe or Ge.

In some embodiments, an interfacial dielectric layer is formed between the channel of the semiconductor nanostructure 25 and the gate dielectric layer 82. In some embodiments, the gate dielectric layer 82 includes a high-k dielectric layer. The gate structure includes the gate dielectric layer 82, the gate electrode layer 84 and sidewall spacers 45. Although FIGS. 1A-1C show four semiconductor nanostructures 25, the number of the semiconductor nanostructures 25 is not limited to four, and may be as small as one or more than four, and may be up to ten. By adjusting the number of the semiconductor wires, a driving current of the GAA FET device can be adjusted.

Further, a source/drain epitaxial layer 50 is disposed over the substrate 10. The source/drain epitaxial layer 50 is in direct contact with end faces of the channel layer 25, and is separated by insulating inner spacers 35 and the gate dielectric layer 82 from the gate electrode layer 84. In some embodiments, a base epitaxial layer 49 is formed below the source/drain epitaxial layer 50. In some embodiments, the semiconductor nanostructures 25 and the base epitaxial layer 49 are made of the same material (e.g., Si, SiGe or Ge), except for a dopant condition (doping element and/or doping concentration). In some embodiments, the base epitaxial layer 49 is made of non-doped semiconductor material and the semiconductor nanostructures 25 are made of the non-doped or doped semiconductor material same as the base epitaxial layer. In some embodiments, when the base epitaxial layer 49 and the semiconductor nanostructures (wires or sheets) 25 are made of SiGe, the Ge amount is the same or different from each other. In other embodiments, the semiconductor nanostructures 25 and the base epitaxial layer 49 are made of different semiconductor material.

In some embodiments, an additional insulating layer (not shown) is conformally formed on the inner surface of the spacer regions. As shown FIG. 1A, the cross section along the X direction of the inner spacer 35 has a rounded shape (e.g., semi-circular or U-shape) convex toward the gate electrode.

An interlayer dielectric (ILD) layer 70 is disposed over the source/drain epitaxial layer 50 and a conductive contact layer 72 is disposed on the source/drain epitaxial layer 50, and a conductive contact plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium. In some embodiments, an etch stop layer 68 is disposed between the sidewall spacers 45 and the ILD layer 70 and on a part of the upper surface of the epitaxial layer 50.

In some embodiments, the FET shown in FIGS. 1A-1D is a p-type FET. The source/drain epitaxial layer includes one or more layers of Si, SiGe, Ge, SiGeSn, SiSn and GeSnP. In some embodiments, the source/drain epitaxial layer further includes boron (B).

FIGS. 2 to 18B show various stages of manufacturing a semiconductor FET device according to an embodiment of the present disclosure. It is understood that additional operations can be provided before, during, and after processes shown by FIGS. 2-18B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1D may be employed in the embodiment of FIGS. 2-18B, and detailed explanation thereof may be omitted.

Figure 2:
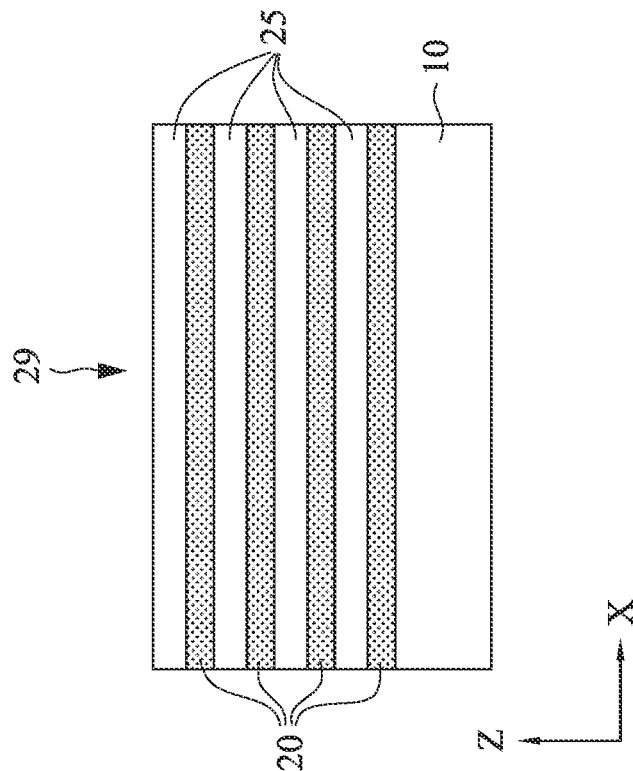
FIG. 2 shows one of the various stages of manufacturing a semiconductor GAA FET device according to an embodiment of the present disclosure.

As shown in FIG. 2, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In some embodiments, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M compound" or an "M based compound" means the majority of the compound is M.

In other embodiments, the second semiconductor layers 25 are $Si_{1-x}Ge_x$, where x is equal to or more than about 0.1 and equal to or less than about 0.6, and the first semiconductor layers 20 are Si or $Si_{1-y}Ge_y$, where y is smaller than x and equal to or less than about 0.2.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although four first semiconductor layers 20 and four second semiconductor layers 25 are shown in FIG. 2, the numbers are not limited to four, and can be 1, 2, 3 or more than 4, and is less than 20. In some embodiments, the number of the first semiconductor layers 20 is greater by one than the number of the second semiconductor layers 25 (i.e.—the top layer is the first semiconductor layer).

Figure 3:
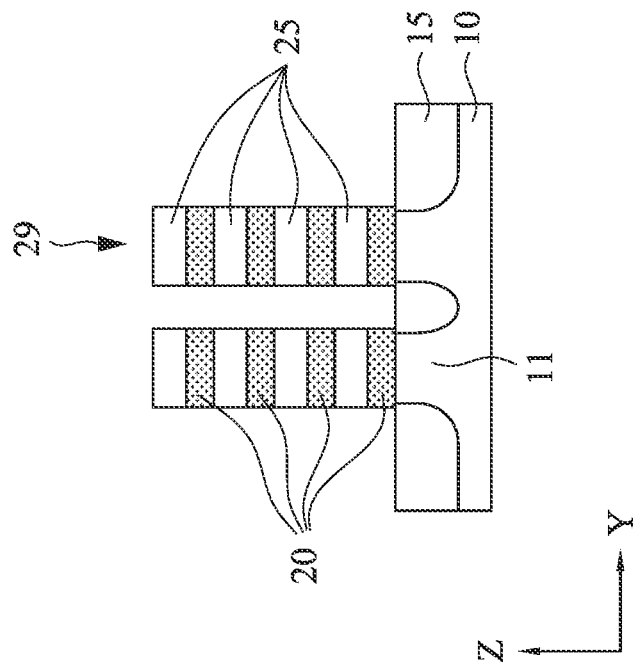
FIG. 3 shows one of the various stages of manufacturing a semiconductor GAA FET device according to an embodiment of the present disclosure.

After the stacked semiconductor layers are formed, fin structures are formed by using one or more lithography and etching operations, as shown in FIG. 3. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 3, the fin structures 29 extend in the X direction and are arranged in the Y direction. The number of the fin structures is not limited to two as shown in FIG. 3, and may be as small as one and three or more. In some embodiments, one or more dummy fin structures are formed on both sides of the fin structures 29 to improve pattern fidelity in the patterning operations. As shown in FIG. 3, the fin structures 29 have upper portions constituted by the stacked semiconductor layers 20, 25 and well portions 11.

The width of the upper portion of the fin structure 29 along the Y direction is in a range from about 10 nm to about 40 nm in some embodiments, and is in a range from about 20 nm to about 30 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 3, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of a p-type GAA FET. In other embodiments, the second semiconductor layers 25 are sacrificial layers which are subsequently partially removed, and the first semiconductor layers 20 are subsequently formed into semiconductor wires as channel layers.

Figure 4A:
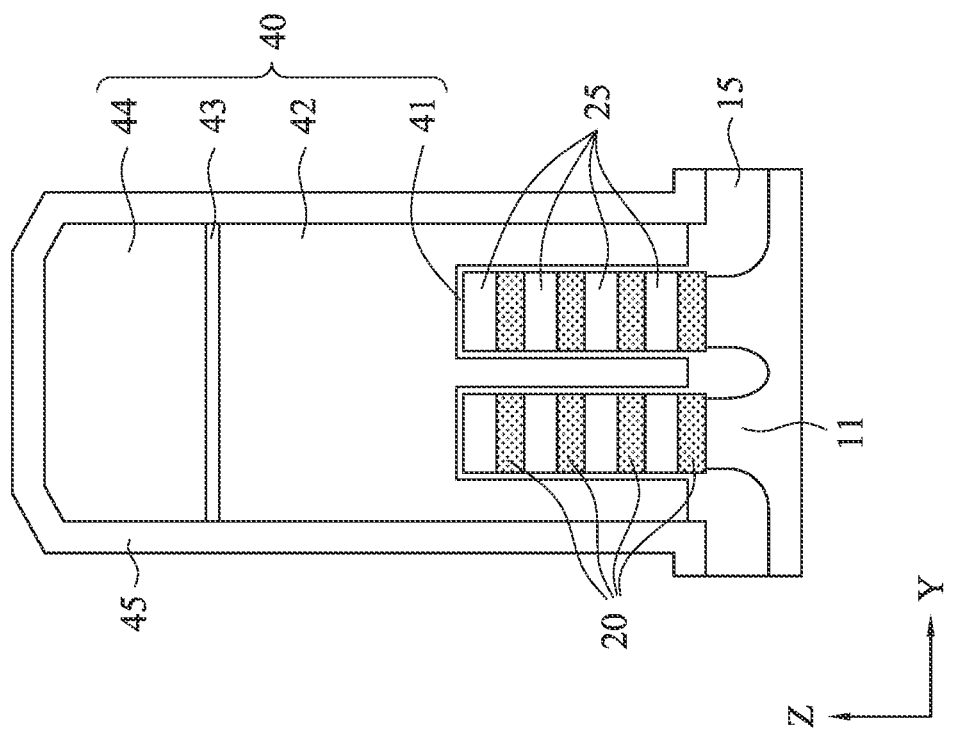
FIGS. 4A and 4B show one of the various stages of manufacturing a semiconductor GAA FET device according to an embodiment of the present disclosure.
Figure 4B:
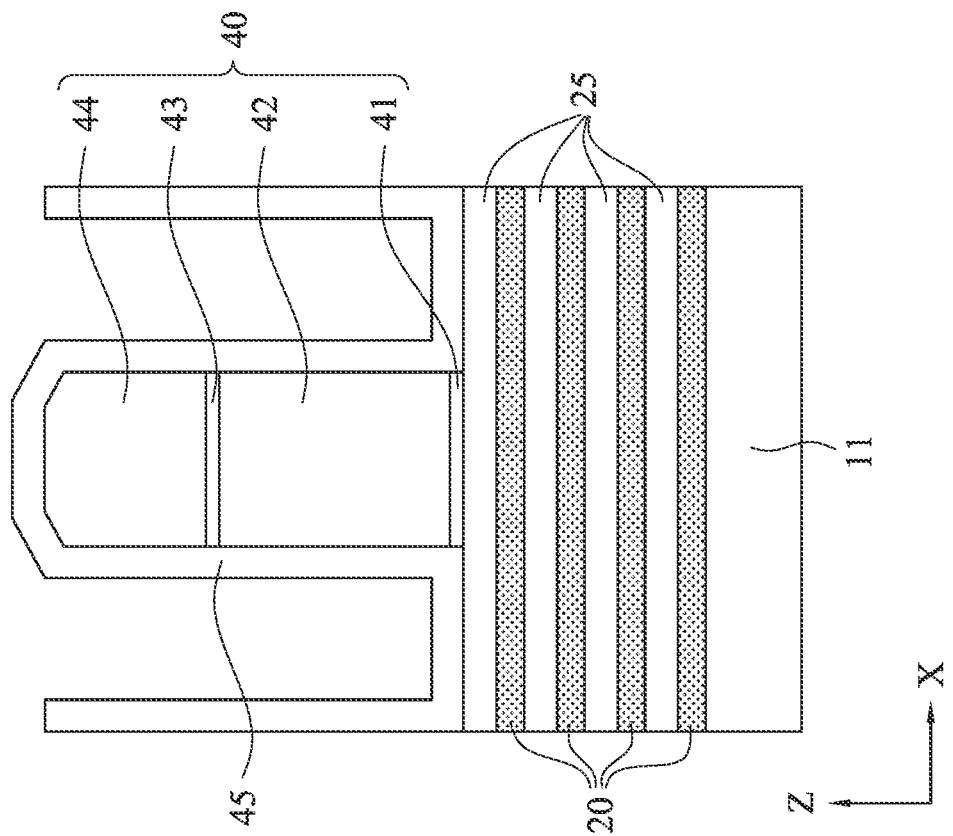

After the isolation insulating layer 15 is formed, a sacrificial (dummy) gate structure 40 is formed, as shown in FIGS. 4A and 4B. FIGS. 4A and 4B illustrate a structure after a sacrificial gate structure 40 is formed over the exposed fin structures 29. The sacrificial gate structure 40 is formed over a portion of the fin structures which is to be a channel region. The sacrificial gate structure 40 defines the channel region of the GAA FET. The sacrificial gate structure 40 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 40 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 40, as shown in FIGS. 4A and 4B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 4A and 4B. In this disclosure, a source and a drain are interchangeably used and the structures thereof are substantially the same. In FIGS. 4A and 4B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for sidewall spacers is formed over the sacrificial gate structure 40, as shown in FIGS. 4A and 4B. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The cover layer 45 can be formed by ALD or CVD, or any other suitable method.

Figure 5:
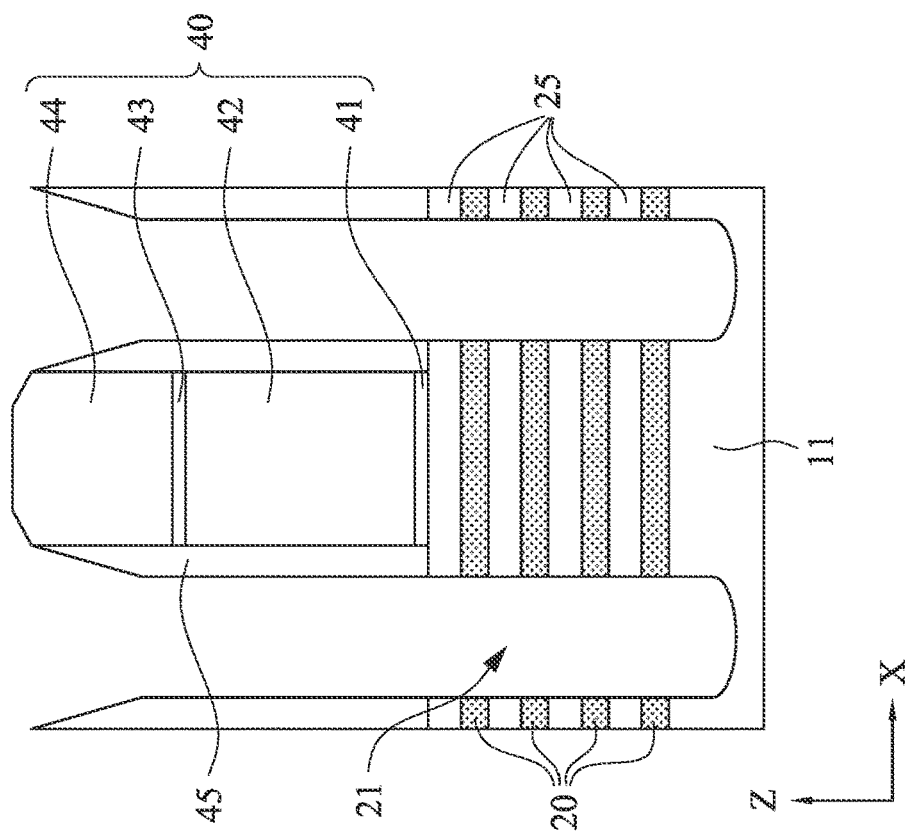
FIG. 5 shows one of the various stages of manufacturing a semiconductor GAA FET device according to an embodiment of the present disclosure.

FIG. 5 shows a cross sectional view along the X direction. Next, as shown in FIG. 5, the first cover layer 45 is anisotropicaly etched to remove the first cover layer 45 disposed on the source/drain region, while leaving the first cover layer 45 as sidewall spacers on side faces of the sacrificial gate structure 40. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched. In some embodiments, an n-type FET and a p-type FET are manufactured separately, and in such a case, a region for one type of FET is processed, and a region for the other type of FET is covered by a protective layer, such as a silicon nitride. In some embodiments, as shown in FIG. 5, the recessed fin structure has a U-shape. In other embodiments, the recessed fin structure has a V-shape showing (111) facets of silicon crystal. In other embodiments, the recess has a reverse trapezoid shape, or a rectangular shape.

In some embodiments, the recess is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. The plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques. The process gases used in the plasma etching process includes etchant gases such as $H_2$, Ar, other gases, or a combination of gases. In some embodiments, carrier gases, such as $N_2$, Ar, He, and Xe, are used in plasma etching process using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The H radicals may selectively etch (100) planes over (111) planes or (110) planes. In some cases, the etch rate of (100) planes may be about three times greater than the etch rate of (111) planes. Due to this selectivity, the etching by the H radicals may tend to slow or stop along (111) planes or (110) planes of silicon during the second patterning process.

Figure 6:
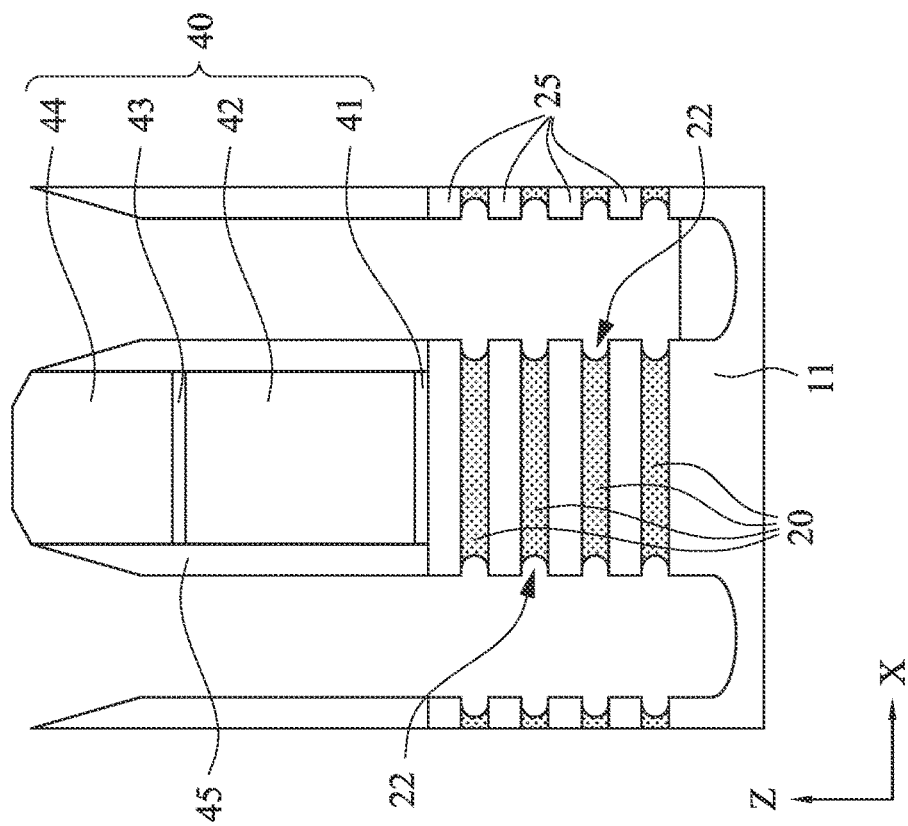
FIG. 6 shows one of the various stages of manufacturing a semiconductor GAA FET device according to an embodiment of the present disclosure.

Further, as shown in FIG. 6, the first semiconductor layers 20 are laterally etched in the X direction within the source/ drain space 21, thereby forming cavities 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

Figure 7:
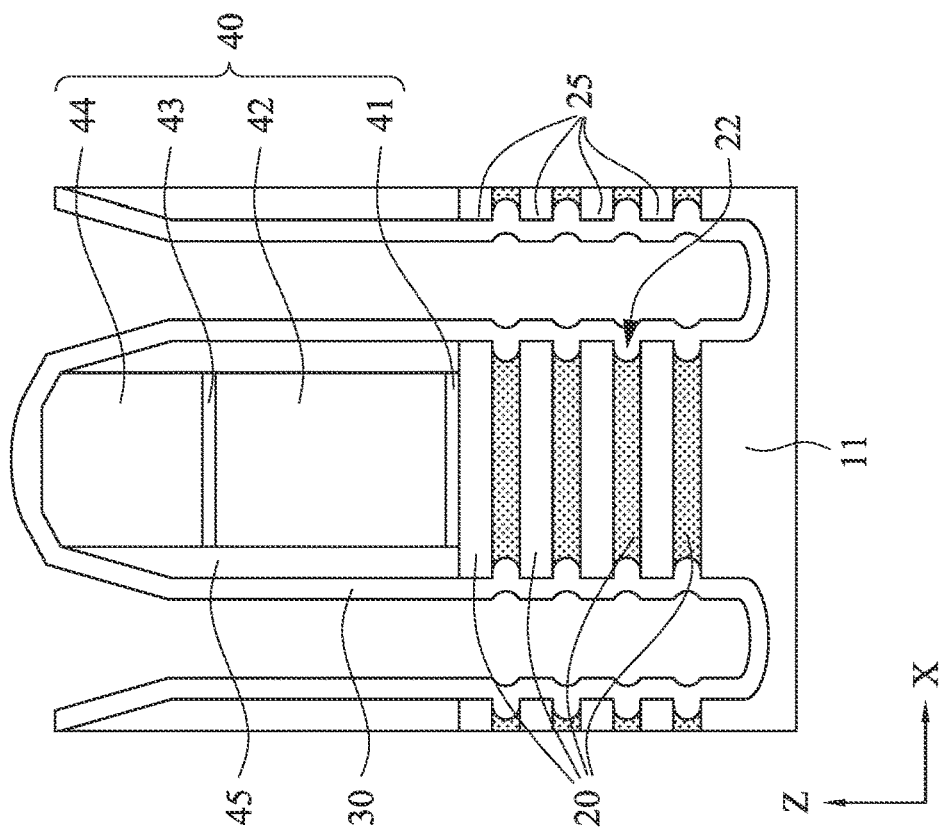
FIG. 7 shows one of the various stages of manufacturing a semiconductor GAA FET device according to an embodiment of the present disclosure.

Next, as shown in FIG. 7, a first insulating layer 30 is conformally formed on the etched lateral ends of the first semiconductor layers 20 and on end faces of the second semiconductor layers 25 in the source/drain space 21 and over the sacrificial gate structure 40. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm in some embodiments. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 are fully filled with the first insulating layer 30.

Figure 8:
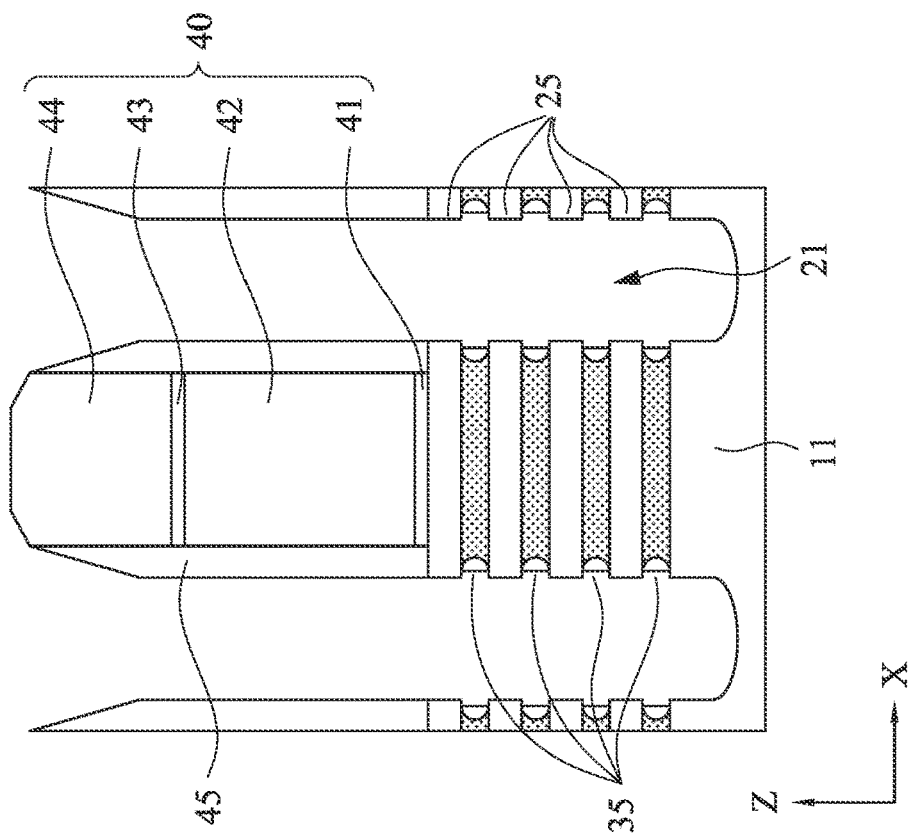
FIG. 8 shows one of the various stages of manufacturing a semiconductor GAA FET device according to an embodiment of the present disclosure.

After the first insulating layer 30 is formed, an etching operation is performed to partially remove the first insulating layer 30, thereby forming inner spacers 35, as shown in FIG. 8. In some embodiments, the end face of the inner spacers 35 is recessed more than the end face of the second semiconductor layers 25. The recessed amount is in a range from about 0.2 nm to about 3 nm and is in a range from about 0.5 nm to about 2 nm in other embodiments. In other embodiments, the recessed amount is less than 0.5 nm and may be equal to zero (i.e.—the end face of the inner spacer 35 and the end face of the second semiconductor layers 25 are flush with each other).

In some embodiments, before forming the first insulating layer 30, an additional insulating layer having a smaller thickness than the first insulating layer 30 is formed, and thus the inner spacers 35 have a two-layer structure. In some embodiments, widths (lateral length) of the inner spacers 35 are not constant.

In FIGS. 9A and 9B to 18A and 18B, the "A" figures show an n-type FET, and the "B" figures show a p-type FET.

Figure 9B:
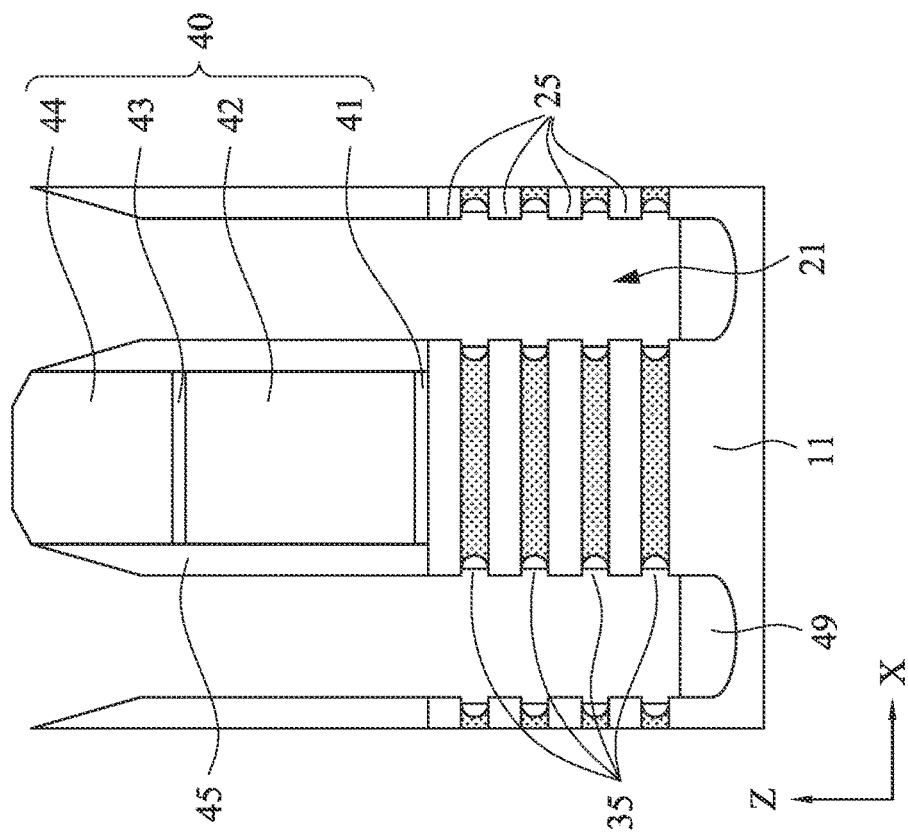
FIGS. 9A and 9B show one of the various stages of manufacturing a semiconductor GAA FET device according to an embodiment of the present disclosure.
Figure 9A:
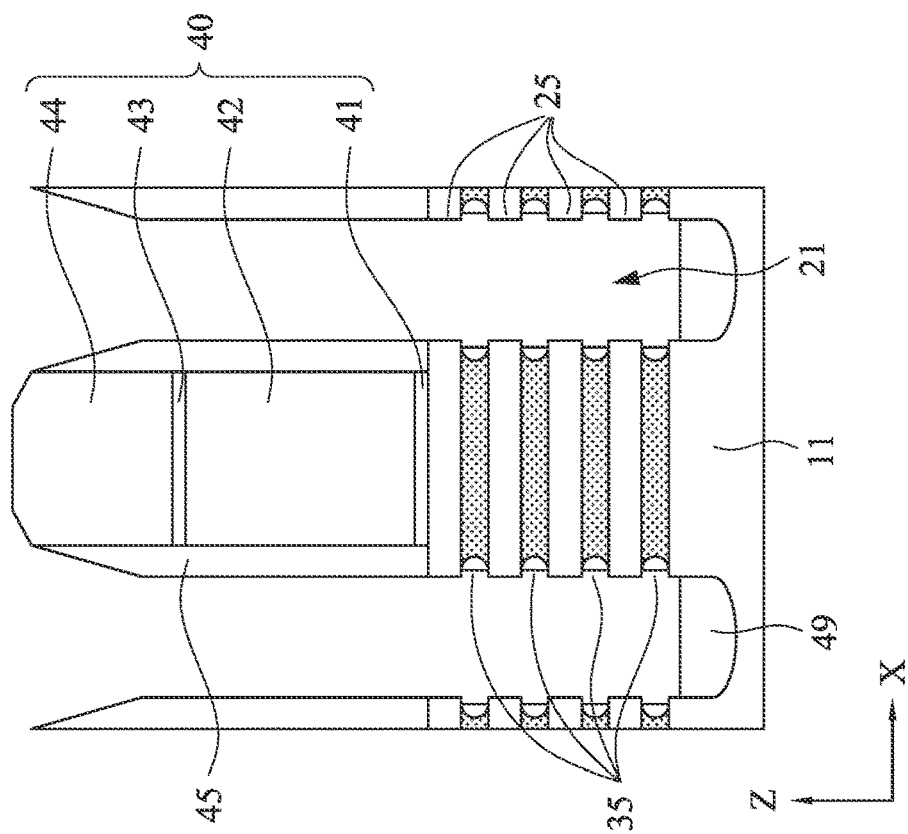

Subsequently, as shown in FIGS. 9A and 9B, a base epitaxial layer 49 is formed on the recessed fin structure 11 at the bottom of the source/drain space 21. In some embodiments, the base epitaxial layer 49 is non-doped Si or non-doped SiGe. In some embodiments, the semiconductor material of the base epitaxial layer 49 is the same as that of the second semiconductor layers 25 (e.g., Si, SiGe or Ge), except for a dopant condition, such as the doping element and/or doping concentration. In some embodiments, the base epitaxial layer 49 is made of non-doped semiconductor material and the second semiconductor layers 25 are made of the non-doped or doped semiconductor material the same as the base epitaxial layer. In some embodiments, when the base epitaxial layer 49 and the second semiconductor layers 25 are made of SiGe, the Ge amount is the same or different from each other. In other embodiments, the second semiconductor layers 25 and the base epitaxial layer 49 are made of different semiconductor materials.

In some embodiments, the thickness of the base epitaxial layer 49 is in a range from about 5 nm to about 50 nm depending on the design and process requirements. In some embodiments, the top of the base epitaxial layer is equal to or lower than the bottom of the bottommost inner spacer 35 or the bottom of the bottommost first semiconductor layers 20. In some embodiments, the base epitaxial layer is not in contact with the bottommost inner spacer 35. In other embodiments, the base epitaxial layer is in contact with the bottommost inner spacer 35.

In some embodiments, no void or seam is formed in the base epitaxial layer 49. In other embodiments, the top of the base epitaxial layer 49 is equal to or ±about 5 nm of the upper surface of the isolation insulating layer 15. The base epitaxial layer 49 is formed by an epitaxial growth method using CVD, ALD or molecular beam epitaxy (MBE), using HCl, $SiH_2Cl_2$ and $SiH_4$ for a Si epitaxial layer or using HCl, $SiH_2Cl_2$ and $GeH_4$ for a SiGe epitaxial layer. The epitaxial growth is a selective growing including etching operations and deposition operations alternately performed in some embodiments. In some embodiments, substantially no base epitaxial layer is formed on the end faces of the second semiconductor layers 25. In some embodiments, a thin semiconductor layer (e.g., about 0.5-1.0 nm) is formed on the end faces of the second semiconductor layers 25. The thin semiconductor layer may be removed before the source/drain epitaxial layer is formed.

In some embodiments, before forming the base epitaxial layer 49, a cleaning operation and/or an annealing operation are performed. In some embodiments, the cleaning operation includes a remote plasma cleaning using mixed gas of $NH_3$ and $NF_3$, to remove a silicon oxide layer. In some embodiments, the annealing is performed at a temperature in a range from about 650° C. to about 700° C. for about 720 seconds to about 1000 seconds.

Figure 10B:
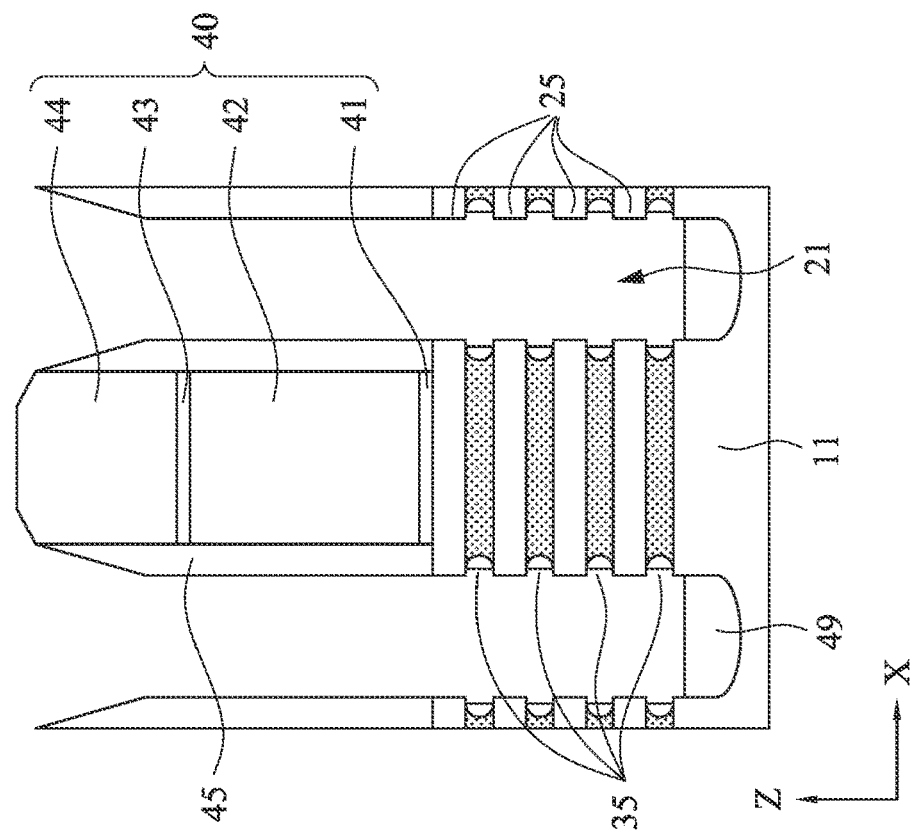
FIGS. 10A and 10B show one of the various stages of manufacturing a semiconductor GAA FET device according to an embodiment of the present disclosure.
Figure 10A:
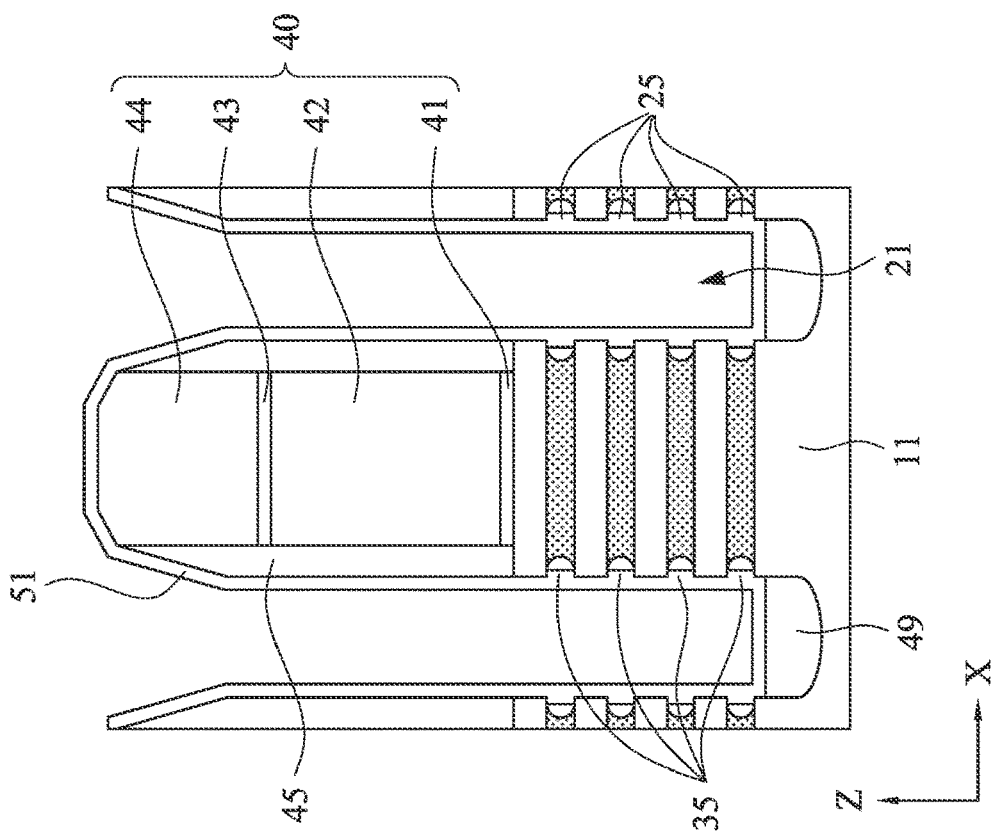

Next, as shown in FIGS. 10A and 10B, an area for n-type FETs is covered by a cover layer 51. The cover layer 51 is formed by using one or more deposition (e.g., dielectric layer deposition), lithography and/or etching operations (e.g., patterning operation). In some embodiments, the cover layer 51 is a photo resist layer or a dielectric layer, such as silicon nitride, silicon oxide, aluminum oxide, or any other suitable material.

Figure 11B:
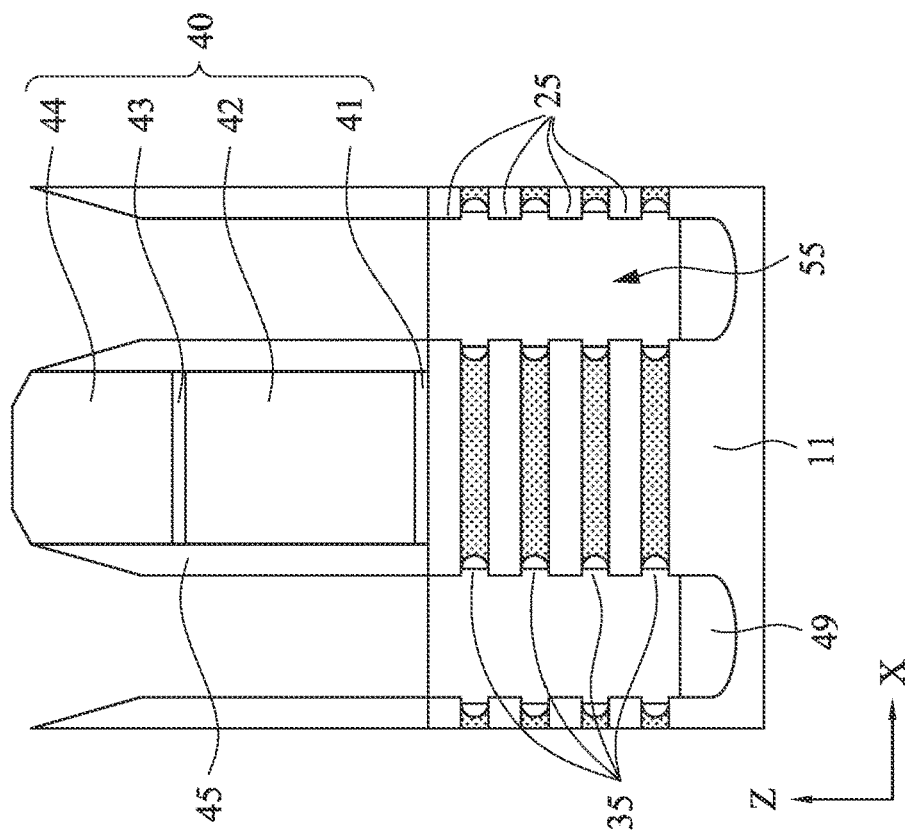
FIGS. 11A and 11B show one of the various stages of manufacturing a semiconductor GAA FET device according to an embodiment of the present disclosure.
Figure 11A:
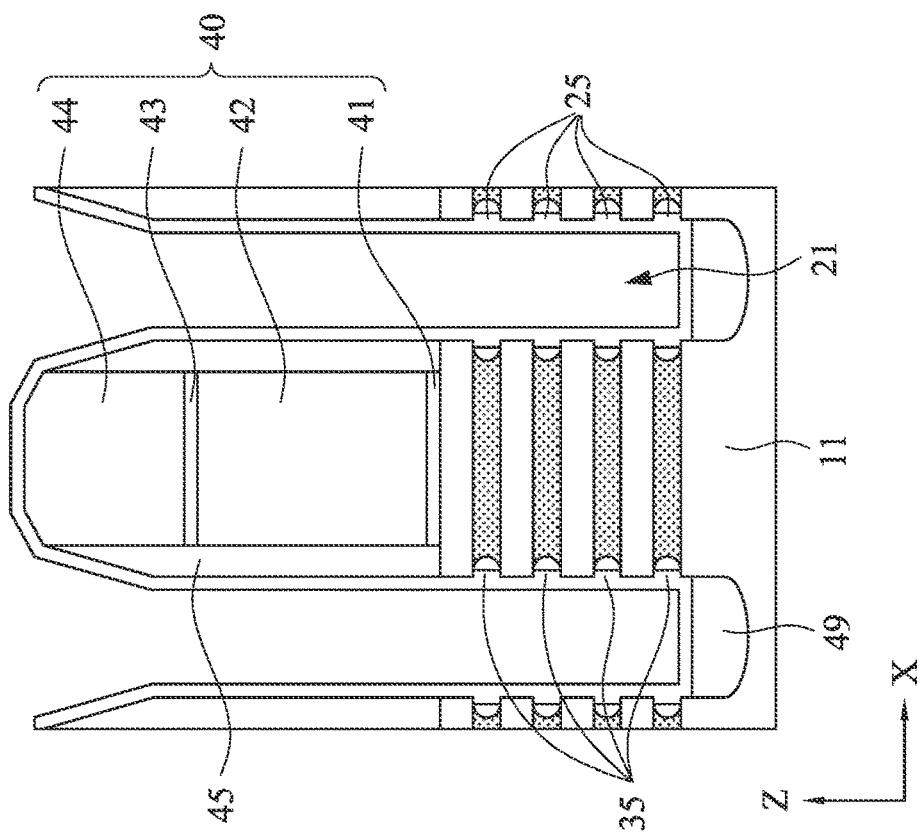

Then, a source/drain epitaxial layer 55 is formed in the source/drain space 21 for the p-type FET, as shown in FIGS. 11A and 11B. The operations of forming the source/drain epitaxial layer 55 are explained below with respect to FIGS. 19A-19D. In some embodiments, the source/drain epitaxial layer 55 include one or more layers of SiGe doped with B. As shown in FIG. 11B, the source/drain epitaxial layer 55 is selectively formed on semiconductor regions. The source/drain epitaxial layer 55 is formed in contact with end faces of the second semiconductor layers 25, and formed in contact with the inner spacers 35.

Figure 12B:
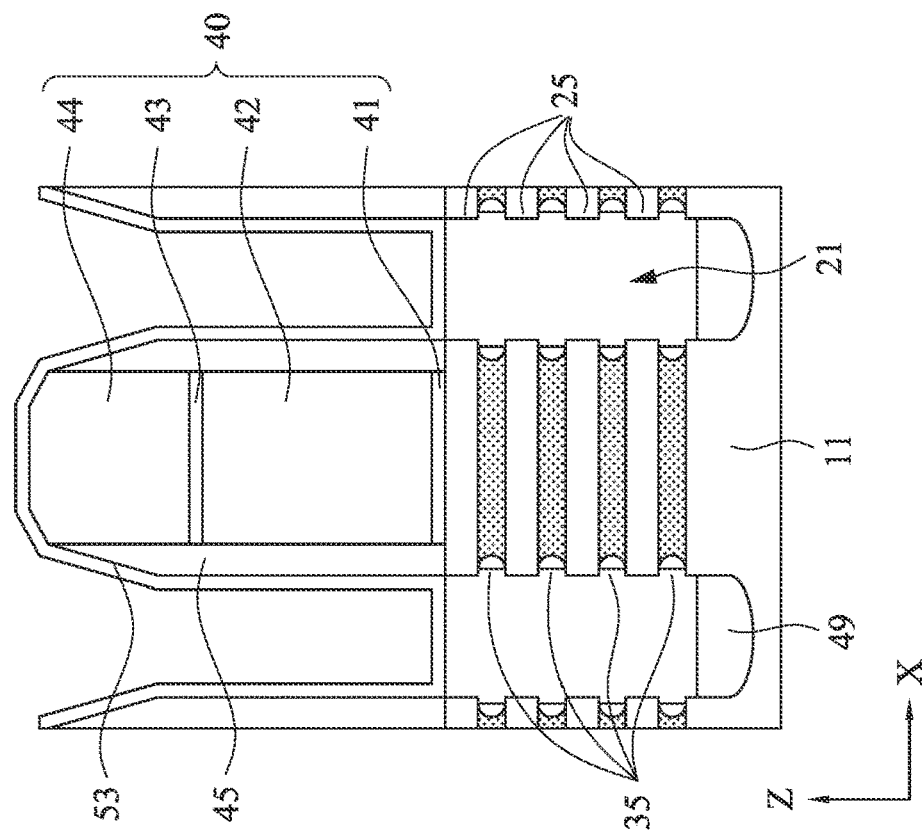
FIGS. 12A and 12B show one of the various stages of manufacturing a semiconductor GAA FET device according to an embodiment of the present disclosure.
Figure 12A:
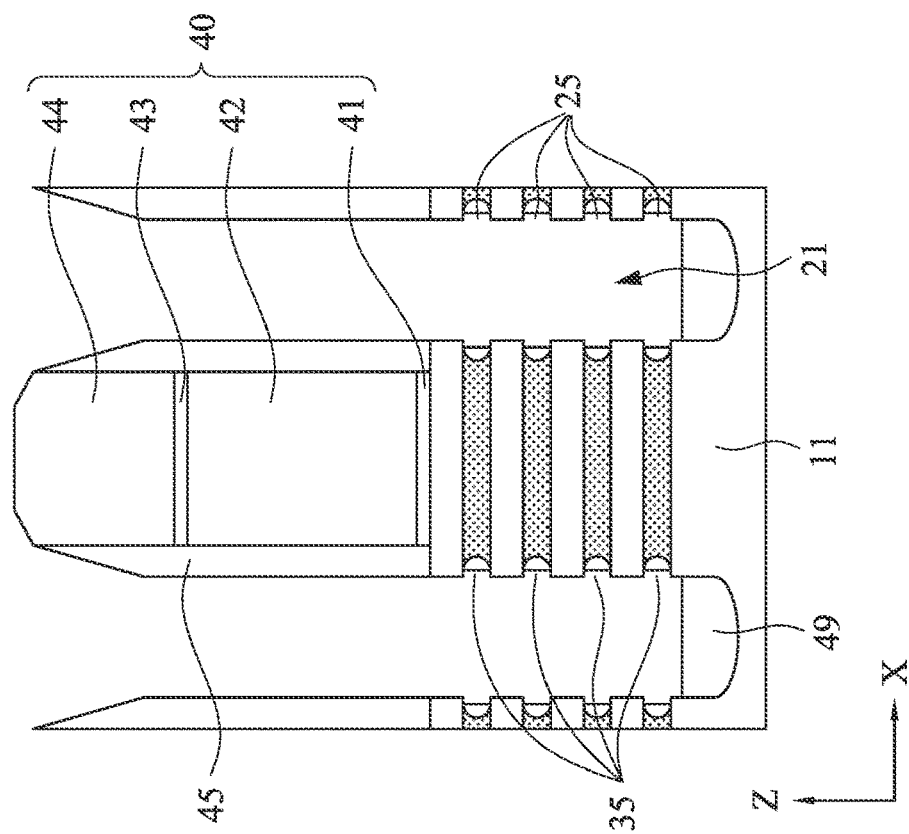

Next, as shown in FIGS. 12A and 12B, the cover layer 51 is removed from the n-type FET region, and the area for p-type FETs is covered by a cover layer 53. The cover layer 53 is formed by using one or more deposition, lithography and/or etching operations. In some embodiments, the cover layer 53 is a photo resist layer or a dielectric layer, such as silicon nitride, silicon oxide, aluminum oxide, or any other suitable material.

Figure 13B:
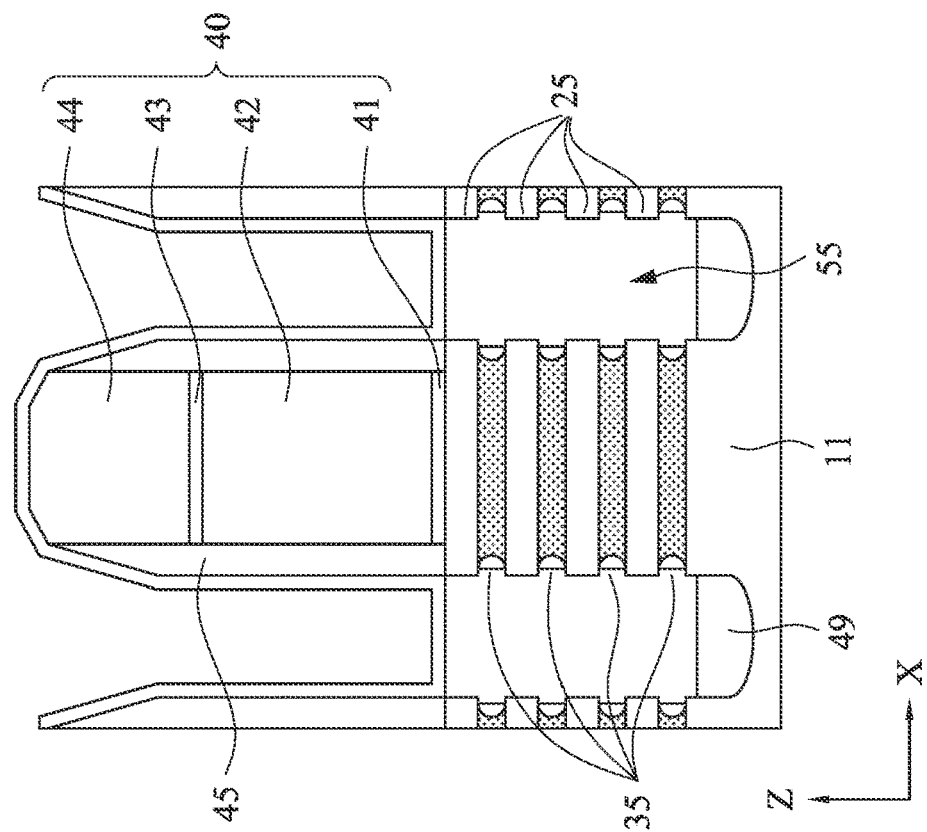
FIGS. 13A and 13B show one of the various stages of manufacturing a semiconductor GAA FET device according to an embodiment of the present disclosure.
Figure 13A:
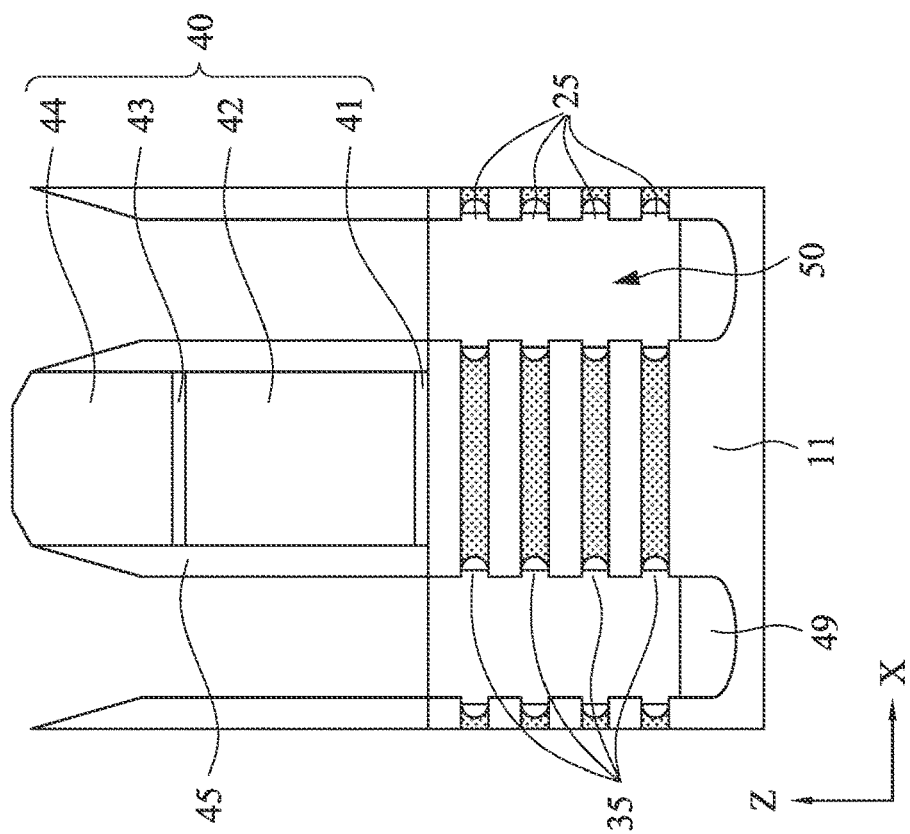

Then, a source/drain epitaxial layer 50 is formed in the source/drain space 21 for the n-type FET, as shown in FIGS. 13A and 13B. The operations of forming the source/drain epitaxial layer 50 are explained below with respect to FIGS. 19A-19D. In some embodiments, the source/drain epitaxial layer 50 include one or more layers of SiP, SiAs and/or SiCP. As shown in FIG. 13A, the source/drain epitaxial layer 50 is selectively formed on semiconductor regions. The source/drain epitaxial layer 50 is formed in contact with end faces of the second semiconductor layers 25, and formed in contact with the inner spacers 35.

Figure 14A:
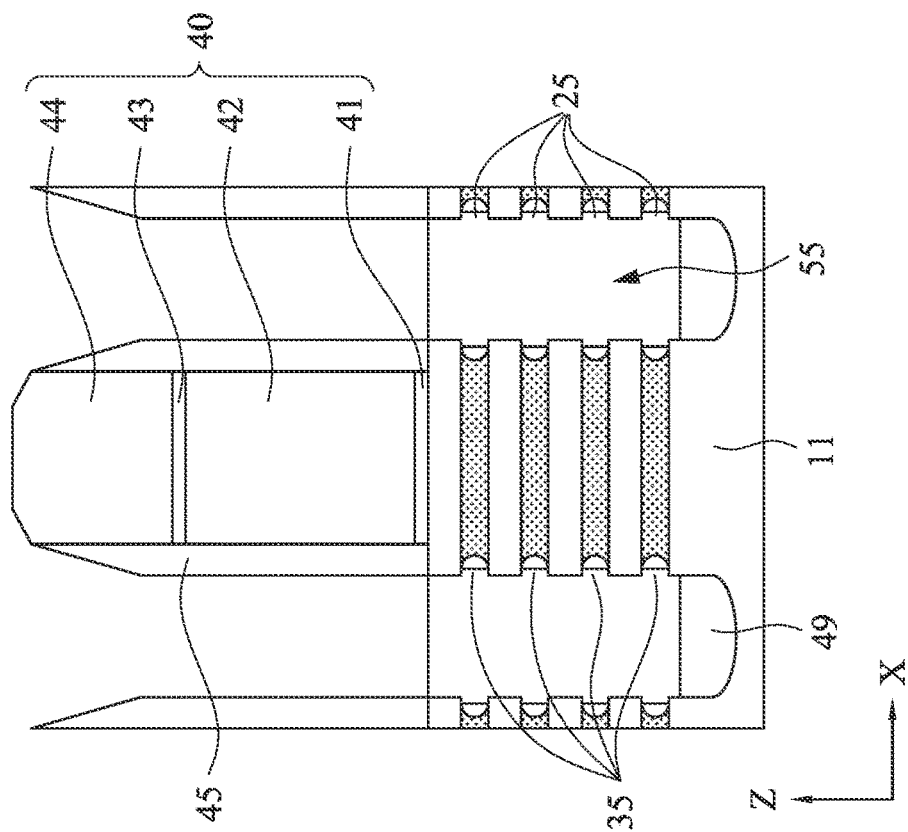
FIGS. 14A and 14B show one of the various stages of manufacturing a semiconductor GAA FET device according to an embodiment of the present disclosure.
Figure 14B:
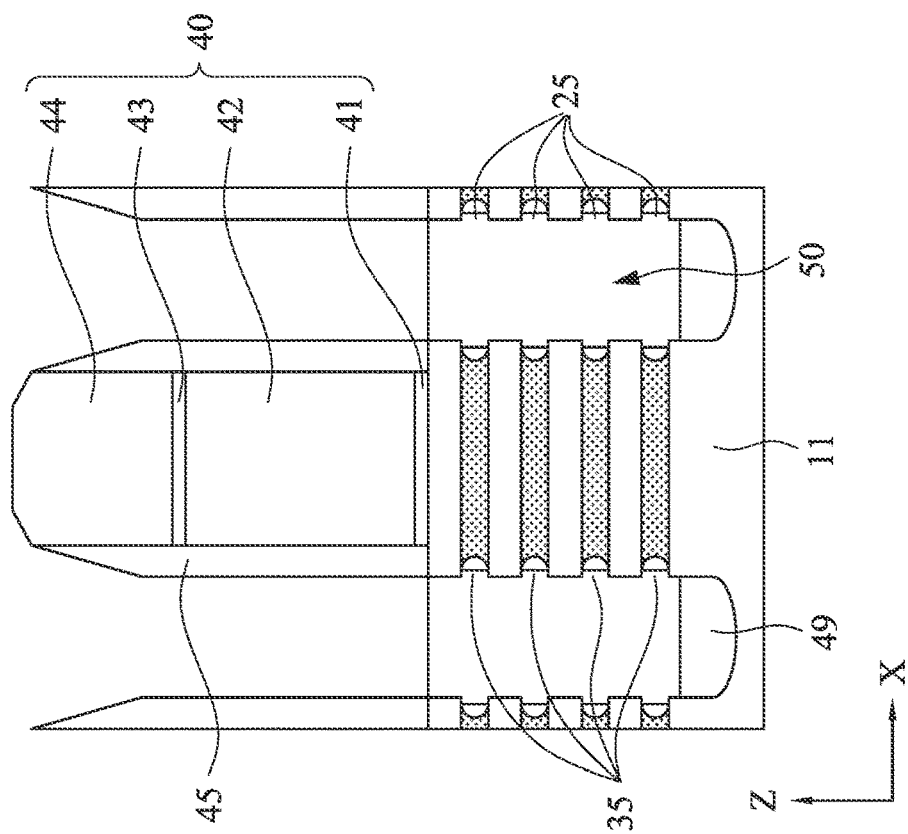

Subsequently, as shown in FIGS. 14A and 14B, the cover layer 53 is removed. In other embodiments, the epitaxial layer 50 for the n-type FET is first formed and then epitaxial layer 55 for the p-type FET is formed.

Figure 15A:
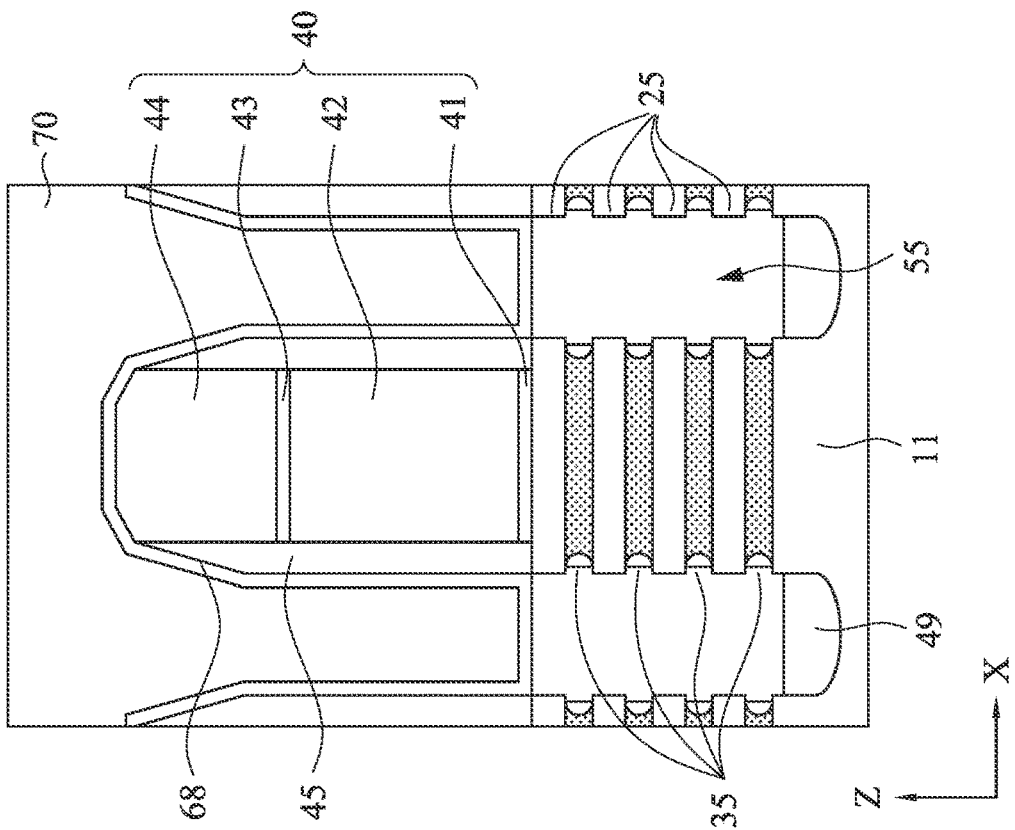
FIGS. 15A and 15B show one of the various stages of manufacturing a semiconductor GAA FET device according to an embodiment of the present disclosure.
Figure 15B:
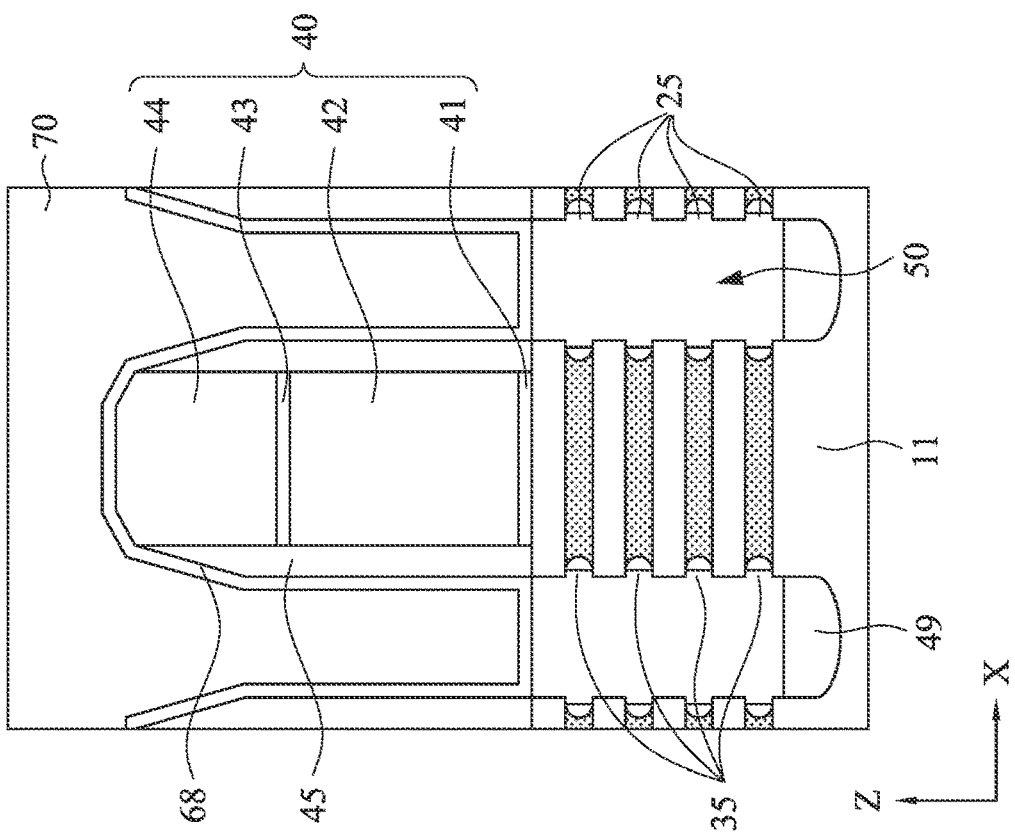

Then, as shown in FIGS. 15A and 15B, an etch stop layer 68 is formed. The etch stop layer 68 includes one of silicon nitride and silicon oxide, SiON, SiOC, SiCN and SiOCN, or any other suitable dielectric material. The etch stop layer 68 is made of a different material than the sidewall spacers (first cover layer) 45. The etch stop layer 68 can be formed by ALD or any other suitable methods. Next, a first interlayer dielectric (ILD) layer 70 is formed over the etch stop layer 68. The materials for the ILD layer 70 include compounds comprising Si, O, C and/or H, such as silicon oxide, SiCOH and SiOC. Organic materials, such as polymers, may be used for the ILD layer 70.

Figure 16A:
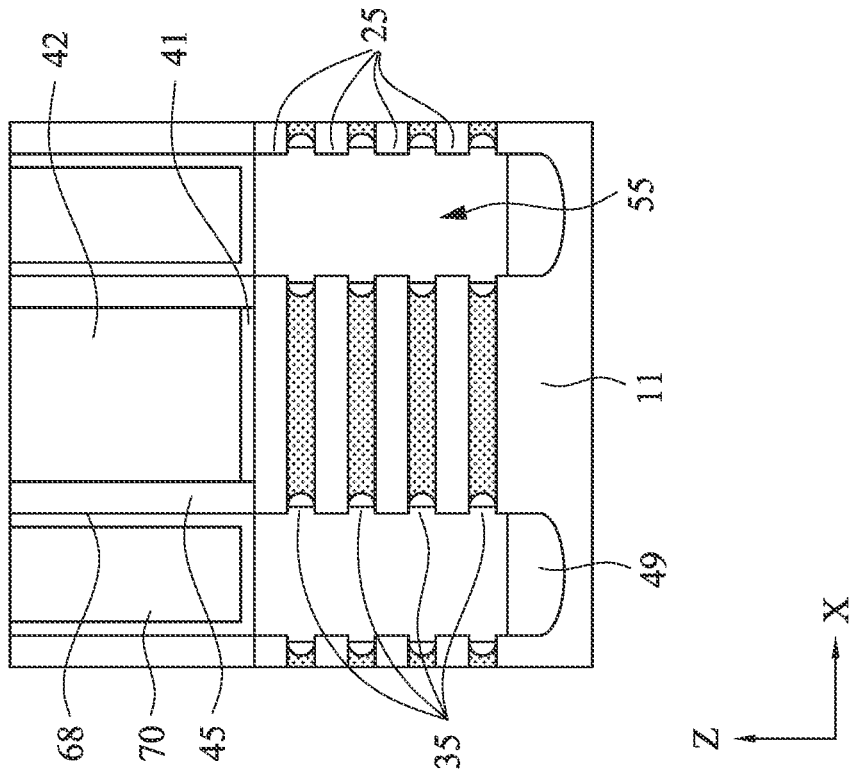
FIGS. 16A and 16B show one of the various stages of manufacturing a semiconductor GAA FET device according to an embodiment of the present disclosure.
Figure 16B:
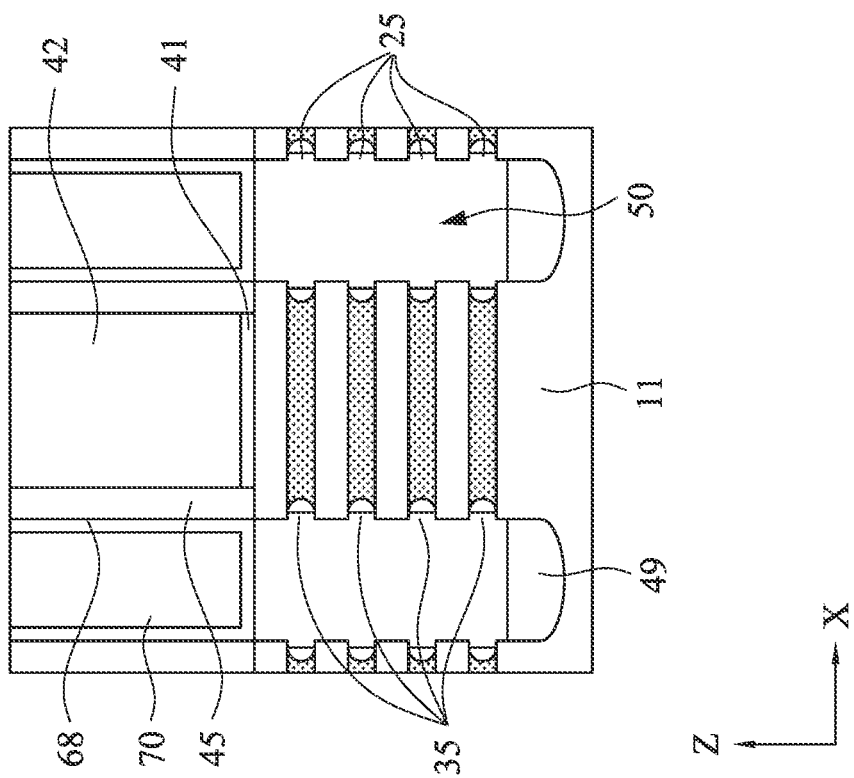

After the ILD layer 70 is formed, a planarization operation, such as CMP, is performed, so that the top portion of the sacrificial gate electrode layer 42 is exposed, as shown in FIGS. 16A and 16B.

Figure 17B:
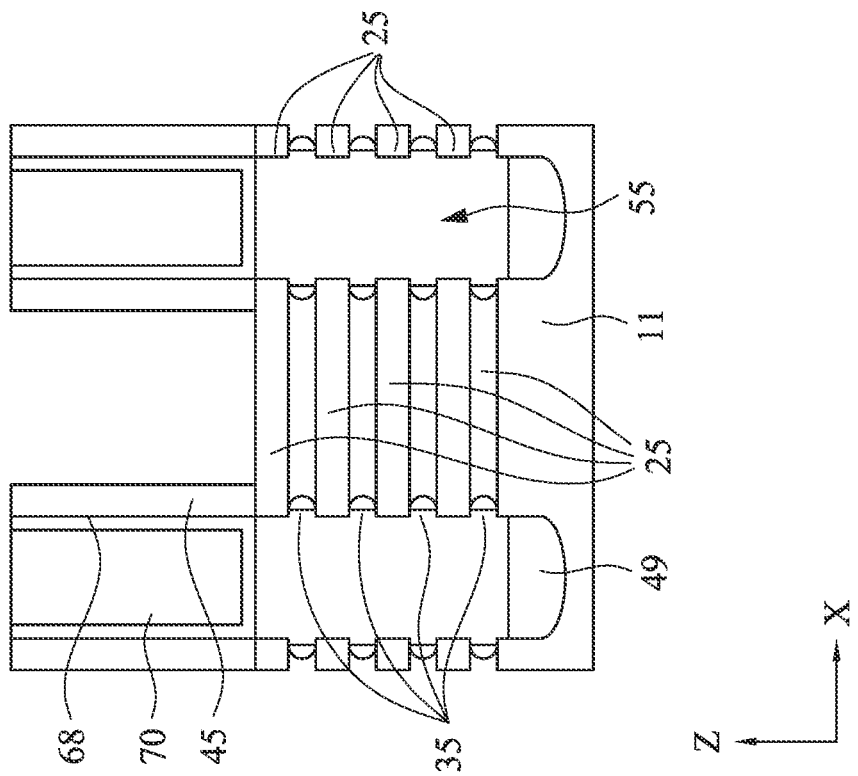
FIGS. 17A and 17B show one of the various stages of manufacturing a semiconductor GAA FET device according to an embodiment of the present disclosure.
Figure 17A:
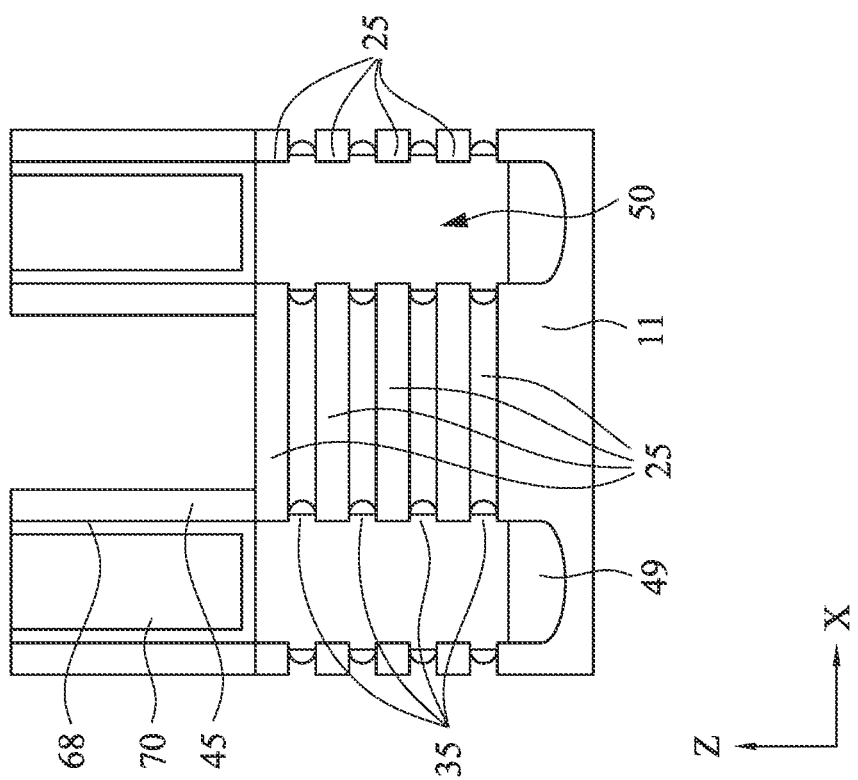

Then, as shown in FIGS. 17A and 17B, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

After the sacrificial gate structures are removed, the first semiconductor layers 20 are removed, thereby forming wires or sheets (channel regions) of the second semiconductor layers 25, as shown in FIGS. 17A and 17B. The first semiconductor layers 20 can be removed or etched using an etchant that can selectively etch the first semiconductor layers 20 against the second semiconductor layers 25, as set forth above. As shown in FIG. 17A, since the first insulating layers (inner spacers) 35 are formed, the etching of the first semiconductor layers 20 stops at the inner spacers 35. In other words, the inner spacers 35 functions as an etch-stop layer for etching of the first semiconductor layers 20.

Figure 18B:
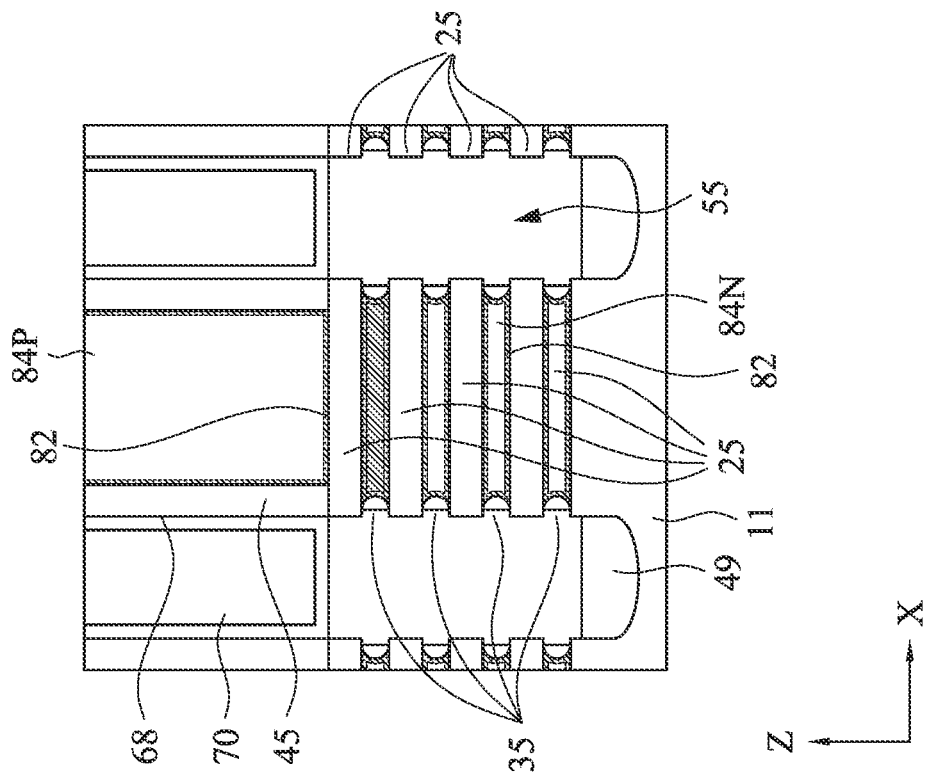
FIGS. 18A and 18B show one of the various stages of manufacturing a semiconductor GAA FET device according to an embodiment of the present disclosure.
Figure 18A:
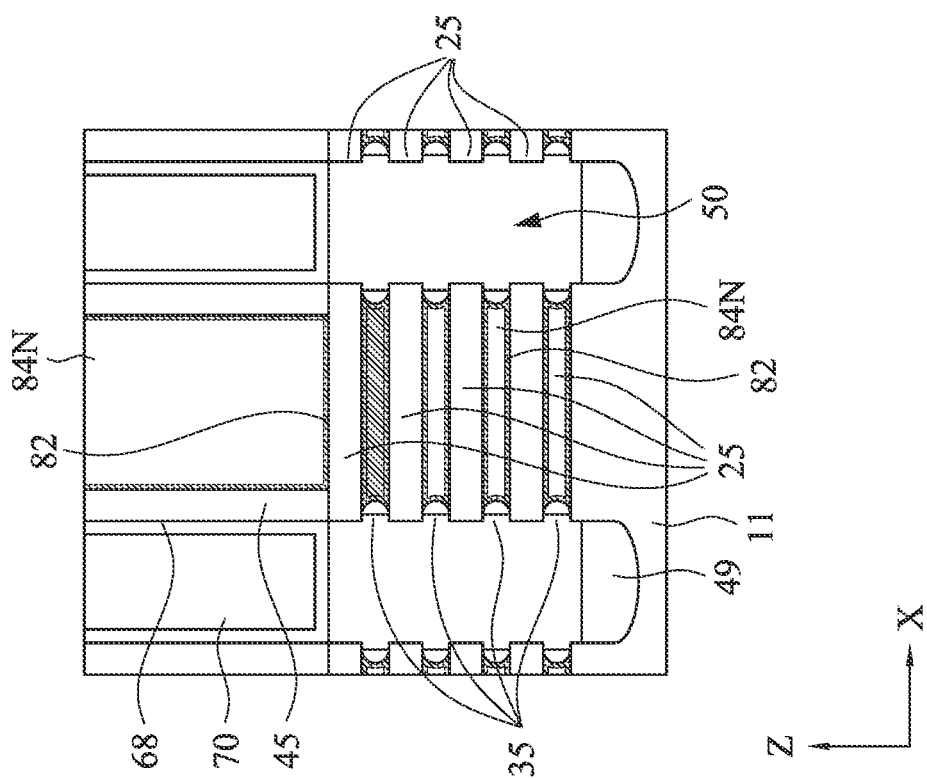

After the semiconductor wires or sheets (channel regions) of the second semiconductor layers 25 are formed, a gate dielectric layer 82 is formed around each of the channel regions. Further, gate electrode layers 84N and 84P are formed on the gate dielectric layer 82, as shown in FIGS. 18A and 18B. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer is formed on the gate dielectric layer 82 to surround each channel layer. The gate electrode includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as silicon nitride. The cap insulating layer is formed by depositing an insulating material followed by a planarization operation.

In certain embodiments of the present disclosure, the gate electrode layer includes one or more work function adjustment layers (not shown) disposed over the gate dielectric layer 82. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, HfTi, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 and the etch stop layer 68 by using dry etching, thereby exposing the upper portion of the source/drain epitaxial layer 50. In some embodiments, a silicide layer is formed over the source/drain epitaxial layer 50. The silicide layer includes one or more of WSi, CoSi, NiSi, TiSi, MoSi and TaSi. Then, a conductive contact layer 72 is formed in the contact holes as shown in FIGS. 1A-1D. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

It is understood that the GAA FETs undergo further CMOS processes to form various features such as contacts/vias, interconnect metal layers, dielectric layers, passivation layers, etc.

Figure 20:
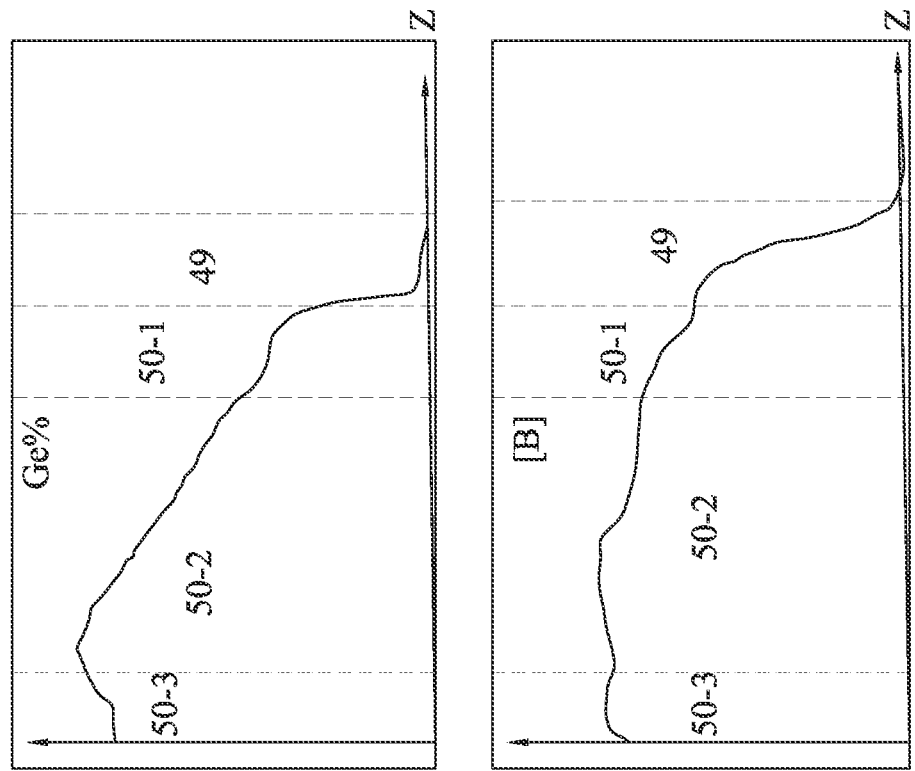
FIG. 20 shows a composition change (profile) of a source/drain epitaxial layer according to an embodiment of the present disclosure.
Figure 20:
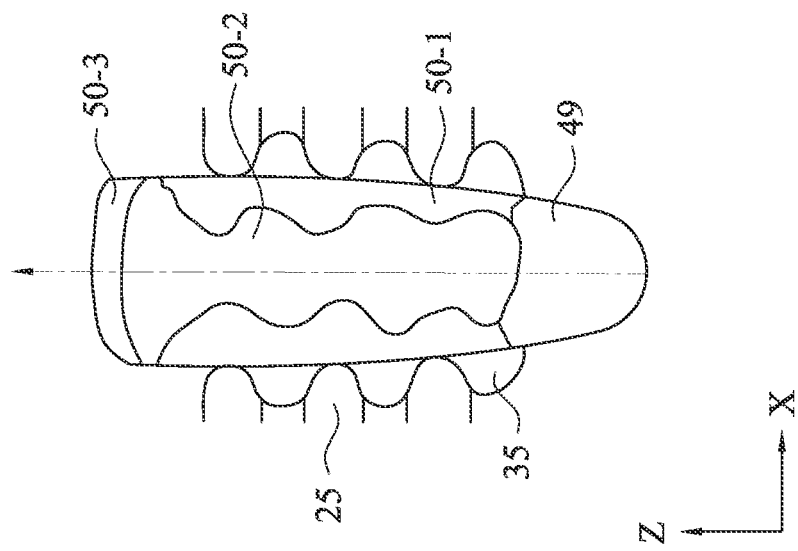

FIGS. 19A-19D show process steps for manufacturing a source/drain epitaxial layer 50, 55 according to embodiments of the present disclosure. FIG. 20 shows a composition change (profile) of a source/drain epitaxial layer according to an embodiment of the present disclosure. FIG. 20 also shows an image of the source/drain epitaxial layer. It is understood that additional operations can be provided before, during, and after processes shown by FIGS. 19A-19D, and some of the operations described below can be replaced or eliminated, for additional embodiments of the method. The order of the operations/processes may be interchangeable. Material, configuration, dimensions and/or processes the same as or similar to the foregoing embodiments described with respect to the foregoing embodiments can be employed in the embodiment of FIGS. 19A-19D, and detailed explanation thereof may be omitted.

FIG. 19A show a cross sectional view after the base epitaxial layer 49 is formed. Before the source/drain epitaxial layers 50 and 55 are formed, a pre-clean operation is performed, respectively, to remove an oxide layer formed on the surface of the recessed fin structure.

In some embodiments, the pre-clean operation includes a plasma treatment using Ar and/or $NH_3$ plasma. The process temperature is in a range from about room temperature to about 300° C. in some embodiments. Then, a chemical cleaning operation is performed using a HCl gas to remove residual gases from a vacuum chamber, which would otherwise cause defects at the N/P boundary and nodule-like defects. The process temperature of the chemical cleaning is higher than the pre-clean temperature and is in a range from about 400° C. to about 700° C. in some embodiments, and is in a range from about 500° C. to about 600° C. in other embodiments.

After the chemical cleaning, a first epitaxial layer 50-1 is formed, as shown in FIG. 19B. In some embodiments, the first epitaxial layer 50-1 is made of SiP or SiAs for the source/drain epitaxial layer 50 for an n-type FET, and is made of SiGe doped with B for the source/drain epitaxial layer 55 for a p-type FET. In some embodiments, the dopants (e.g., P, As or B) diffuse into the base epitaxial layer 49, thereby forming a lightly doped region (having a lower dopant concentration than the first epitaxial layer and higher dopant concentration than the base epitaxial layer 49) between the first epitaxial layer 50-1 and the base epitaxial layer 49.

In some embodiments, for a p-type FET, the second semiconductor layers 25 are made of are $Si_{1-x}Ge_x$, where x is equal to or more than about 0.2 and equal to or less than about 0.3. The Ge content in the first epitaxial layer 50-1 for a p-type FET is the same as the Ge content of the second semiconductor layers 25 or the difference in the Ge content is about 0.01 to 0.03 in some embodiments.

In some embodiments, as shown in FIG. 20, the Ge content increases as the first epitaxial layer 50-1 is grown. In some embodiments, the Ge content increases from about 0 atomic % (Si) up to about 15-25 atomic %, for example, 20 atomic % ($Si_{0.8}Ge_{0.2}$). In some embodiments, the average B concentration of the first epitaxial layer 50-1 is in a range from about $5\times10^{19}$ atoms/cm$^3$ to about $1\times10^{21}$ atoms/cm$^3$, and is in a range from about $1\times10^{20}$ atoms/cm$^3$ to about $5\times10^{20}$ atoms/cm$^3$ in other embodiments. In some embodiments, the B concentration increases as the first epitaxial layer 50-1 is grown. In some embodiments, the first epitaxial layer 50-1 for the p-type FET is formed by an epitaxial growth method using CVD, ALD or molecular beam epitaxy (MBE), using HCl, $SiH_2Cl_2$ and $GeH_4$. The epitaxial growth is a selective growing including etching operations and deposition operations alternately performed in some embodiments.

In some embodiments, for an n-type FET, the second semiconductor layers 25 are made of are Si. The first epitaxial layer 50-1 includes no Ge in some embodiments, and is made of SiP, SiPAs or SiAs. In some embodiments, P or As may be considered as a dopant or impurity in a Si layer. When the first epitaxial layer 50-1 includes P, the P content increases as the first epitaxial layer 50-1 is grown. In some embodiments, the average P concentration of the first epitaxial layer 50-1 is in a range from about $5\times10^{19}$ atoms/cm$^3$ to about $1\times10^{21}$ atoms/cm$^3$, and is in a range from about $1\times10^{20}$ atoms/cm$^3$ to about $5\times10^{20}$ atoms/cm$^3$ in other embodiments. In some embodiments, the first epitaxial layer 50-1 for the n-type FET is formed by an epitaxial growth method using CVD, ALD or molecular beam epitaxy (MBE), using HCl, $SiH_2Cl_2$ and $SiH_4$. The epitaxial growth is a selective growing including etching phases and deposition phases alternately performed in some embodiments.

The thickness of the first epitaxial layer 50-1 measured in the horizontal direction over the second semiconductor layer 25 is in a range from about 2 nm to about 10 nm in some embodiments. The thickness of the first epitaxial layer 50-1 measured in the vertical direction over the base epitaxial layer 49 is smaller than the thickness of the base epitaxial layer and greater than the horizontal thickness, and is in a range from about 10 nm to about 20 nm in some embodiments.

The process temperature for forming the first epitaxial layer 50-1 is lower than that of the baking/annealing operation and higher than the temperature for forming the first epitaxial layer 50-1. In some embodiments, the process temperature for forming the first epitaxial layer 50-1 is in a range from about 550° C. to about 750° C. and is in a range from about 600° C. to about 700° C. in other embodiments.

After the first epitaxial layer 50-1 is formed, a second epitaxial layer 50-2 is formed as shown in FIG. 19C.

In some embodiments, for a p-type FET, the second epitaxial layer 50-2 is made of SiGe doped with B. As shown in FIG. 20, the Ge content increases as the second epitaxial layer 50-2 is grown. In some embodiments, the Ge content increases from about 20 atomic %, to up to about 30-60 atomic %. In some embodiments, the average B concentration of the second epitaxial layer 50-2 is equal to or higher than the largest B concentration of the first epitaxial layer 50-1, and is in a range from about $1\times10^{19}$ atoms/cm$^3$ to about $5\times10^{21}$ atoms/cm$^3$, and is in a range from about $5\times10^{19}$ atoms/cm$^3$ to about $2\times10^{21}$ atoms/cm$^3$ in other embodiments. The thickness of the second epitaxial layer 50-2 measured in the horizontal direction at the end of the second semiconductor layer 25 is in a range from about 20 nm to about 60 nm in some embodiments, depending on the design and/or process requirements. The thickness of the second epitaxial layer 50-2 measured in the vertical direction is greater than the horizontal thickness, and is in a range from about 40 nm to about 100 nm in some embodiments. In some embodiments, the second epitaxial layer 50-2 for the p-type FET is formed by an epitaxial growth method using CVD, ALD or molecular beam epitaxy (MBE), using HCl, $SiH_2Cl_2$ and $GeH_4$. The epitaxial growth is a selective growing including etching operations and deposition operations alternately performed in some embodiments. In some embodiments, the last step is an etching operation to remove the top of the second epitaxial layer 50-2 so that the second epitaxial layer does not touch the gate sidewall spacers 45. In some embodiments, the second epitaxial layer 50-2 is in contact with the uppermost one of the second semiconductor layer 25. In some embodiments, the top of the second epitaxial layer 50-2 is higher than the top of the uppermost second semiconductor layers 25 by about 1-10 nm. The process temperature for forming the second epitaxial layer 50-2 is lower than that of the baking/annealing operation and higher than the temperature for forming the first epitaxial layer 50-1. In some embodiments, the process temperature for forming the second epitaxial layer 50-2 is in a range from about 550° C. to about 750° C. and is in a range from about 600° C. to about 700° C. in other embodiments.

In some embodiments, for an n-type FET, the second epitaxial layer 50-2 is made of SiP. The P content increases as the second epitaxial layer 50-2 is grown in some embodiments. In some embodiments, the average P concentration of the second epitaxial layer 50-2 is equal to or higher than the largest P concentration of the first epitaxial layer 50-1, and is in a range from about $1\times10^{19}$ atoms/cm$^3$ to about $5\times10^{21}$ atoms/cm$^3$, and is in a range from about $5\times10^{19}$ atoms/cm$^3$ to about $2\times10^{21}$ atoms/cm$^3$ in other embodiments. In some embodiments, the second epitaxial layer 50-2 for the n-type FET is formed by an epitaxial growth method using CVD, ALD or molecular beam epitaxy (MBE), using PH$_3$, SiH$_2$Cl$_2$ and SiH$_4$. In some embodiments, the process temperature for forming the second epitaxial layer 50-2 is in a range from about 550° C. to about 750° C. and is in a range from about 600° C. to about 700° C. in other embodiments.

In some embodiments, as shown in FIG. 19D, a third epitaxial layer 50-3 is formed over the second epitaxial layer 50-2 to facilitate a subsequent alloy formation operation, such as silicide layer formation. In some embodiments, the third epitaxial layer 50-3 is made of SiGe doped with B for a p-type FET and SiP for an n-type FET.

In some embodiments, the Ge content decreases as the epitaxial layer 50-3 is grown. In some embodiments, as shown in FIG. 20, the Ge content decreases from about 30-60 atomic % to about 20-30 atomic %. In some embodiments, the Ge content is substantially constant and is in a range from about 40 atomic % to about 60 atomic %. In some embodiments, the average Ge content of the third epitaxial layer 50-3 is smaller than the Ge content of the second epitaxial layer and higher than that of the first epitaxial layer. In some embodiments, the average B or P concentration of the third epitaxial layer 50-3 is in a range from about $5\times10^{20}$ atoms/cm$^3$ to about $5\times10^{21}$ atoms/cm$^3$, and is in a range from about $1\times10^{21}$ atoms/cm$^3$ to about $3\times10^{21}$ atoms/cm$^3$ in other embodiments. In some embodiments, the B or P concentration decreases as the growth of the third epitaxial layer 50-3. In other embodiments, the B or P concentration is substantially constant in the third epitaxial layer 50-3. The thickness of the third epitaxial layer 50-3 measured in the horizontal direction at the end of the second semiconductor layer 25 is in a range from about 10 nm to about 30 nm in some embodiments, depending on the design and/or process requirements. The thickness of the third epitaxial layer 50-3 measured in the vertical direction is greater than the horizontal thickness, and is in a range from about 20 nm to about 60 nm in some embodiments. In some embodiments, the third epitaxial layer 50-3 for the p-type FET is formed by an epitaxial growth method using CVD, ALD or molecular beam epitaxy (MBE), using HCl, SiH$_2$Cl$_2$ and GeH$_4$. In some embodiments, the third epitaxial layer 50-3 for the n-type FET is formed by an epitaxial growth method using CVD, ALD or molecular beam epitaxy (MBE), using PH$_3$, SiH$_2$Cl$_2$ and SiH$_4$. The process temperature for forming the third epitaxial layer 50-3 is in a range from about 600° C. to about 700° C. in some embodiments. In some embodiments, in addition to or instead of the third epitaxial layer, an ion implantation operation to introduce B or P into the second or third epitaxial layers is performed. In some embodiments, third epitaxial layer 50-3 is in direct contact with the first epitaxial layer 50-1, and in other embodiments, the third epitaxial layer 50-3 is separated from the first epitaxial layer 50-1 by the second epitaxial layer 50-2.

In some embodiments, the first to third epitaxial layers are continuously formed in a same chamber by changing deposition conditions (e.g., gas, pressure and/or temperature), which is an in-situ deposition, while the base epitaxial layer is an ex-situ deposition formed in a separate chamber than the formation of the source/drain epitaxial layers (discontinuous). In some embodiments, the base epitaxial layer 49 is lightly doped, of which doping amount is smaller than that of the first epitaxial layer (e.g., about 1/100 to about 1/10 less than the doping amount of the first epitaxial layer). In some embodiments, since the impurities or Ge are diffused from the source/drain epitaxial layer 50 or 55, the epitaxial layer 49 may be doped. The doping amount, if any, is about $1\times10^{17}$ atoms/cm$^3$ to about $0.5\times10^{19}$ atoms/cm$^3$, in some embodiments.

Figure 21B:
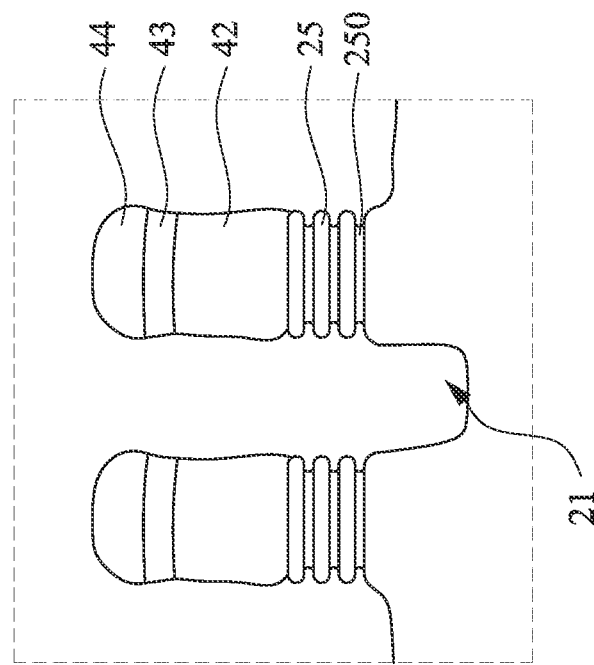
FIGS. 21A and 21B show cross sectional views at one of the various stages of manufacturing a semiconductor GAA FET device according to embodiments of the present disclosure.
Figure 21A:
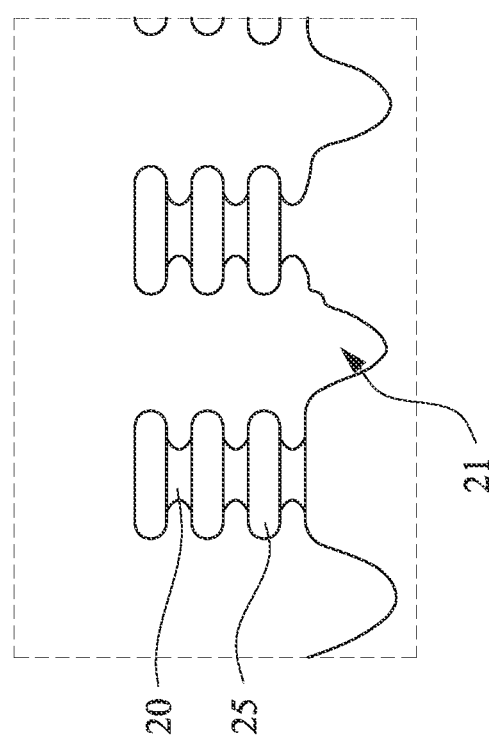

FIGS. 21A and 21B show the structure after the source/drain space 21 is formed. In FIG. 21A, the sacrificial gate structure is not shown. In some embodiments, when the gate length Lg is small, for example, in a range from about 5 nm to about 9 nm, the depth of the source/drain space 21 from the top of the fin structure 11 is in a range from about 5 nm to about 30 nm, and the bottom shape of the space 21 has a V-shape, as shown in FIG. 21A. In some embodiments, when the gate length Lg is large, for example, in a range from about 20 nm to about 50 nm, the depth of the source/drain space 21 from the top of the fin structure 11 is in a range from about 15 nm to about 50 nm, and the bottom shape of the space 21 has a U-shape, as shown in FIG. 21B.

Figure 22B:
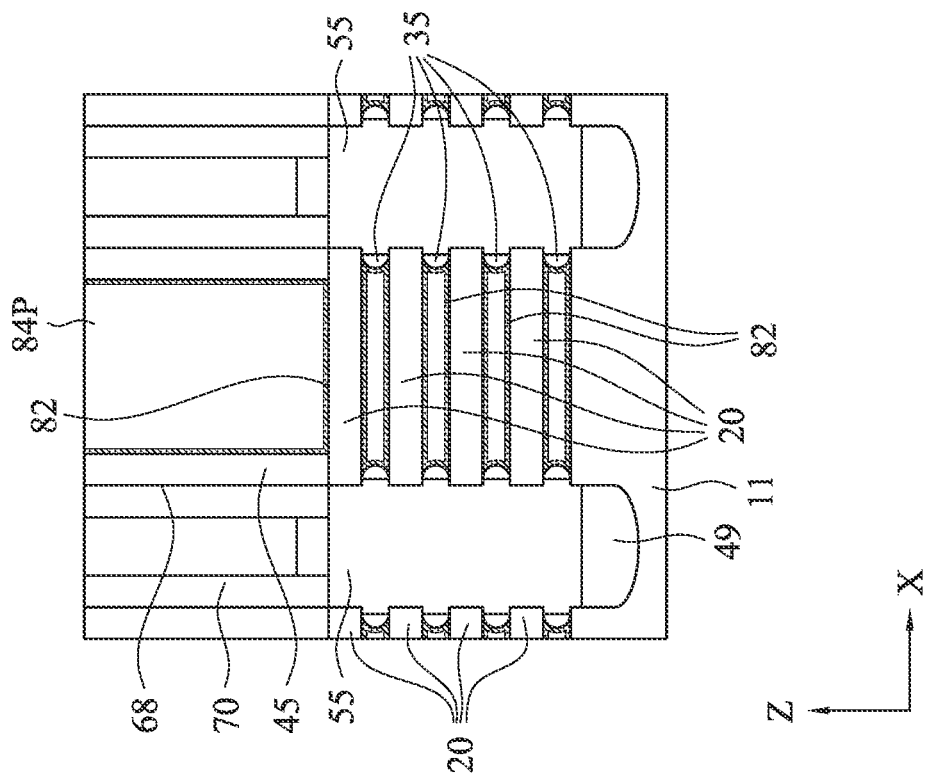
FIGS. 22A and 22B show cross sectional views of a semiconductor GAA FET device according to embodiments of the present disclosure.
Figure 22A:
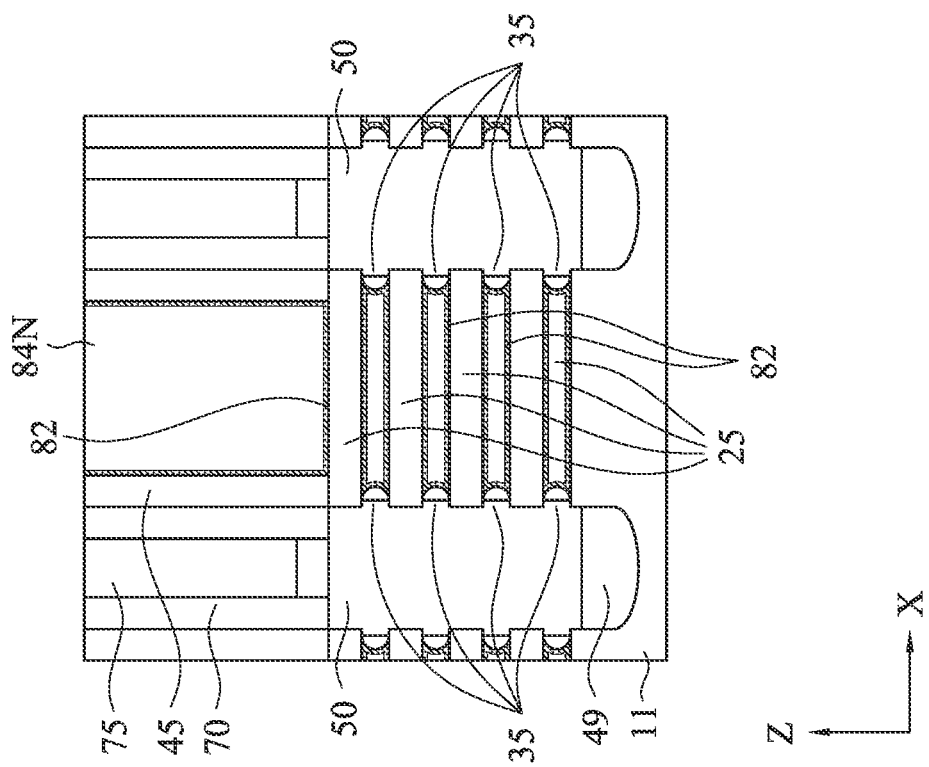

FIGS. 22A and 22B show cross sectional views of semiconductor GAA FET devices according to embodiments of the present disclosure. Material, configuration, dimensions and/or processes the same as or similar to the foregoing embodiments described with respect to the foregoing embodiments can be employed in the embodiment of FIGS. 22A and 22B, and detailed explanation thereof may be omitted.

In some embodiments, as shown in FIG. 22A, the bottom of the base epitaxial layer 49 (the bottom of the source/drain space 21) has a V-shape. In some embodiments, the V-shaped recess of the source/drain space 21 is formed by a dry etching process, which may be anisotropic. The anisotropic etching process may be performed using a process gas mixture including BF$_2$, Cl$_2$, CH$_3$F, CH$_4$, HBr, O$_2$, Ar, other etchant gases. The plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques. The process gases used in the plasma etching process includes etchant gases such as H$_2$, Ar, other gases, or a combination of gases. In some embodiments, carrier gases, such as N$_2$, Ar, He, and Xe are used in a plasma etching process using hydrogen (H) radicals. The H radicals may be formed by flowing H$_2$ gas into a plasma generation chamber and igniting a plasma within the plasma generation chamber. In some embodiments, an additional gas may be ignited into a plasma within the plasma generation chamber, such as Ar. The H radicals may selectively etch the (100) planes over the (111) planes or the (110) planes. In some cases, the etch rate of the (100) planes may be about three times greater than the etch rate of the (111) planes. Due to this selectivity, the etching by the H radicals may tend to slow or stop along the (111) planes or the (110) planes of silicon during the second patterning process. The V-shape recess can be applied to both n-type and p-type FETs.

In some embodiments, the channel regions are constituted by the first semiconductor nanostructures 20, as shown in FIG. 22B. In some embodiments, the first semiconductor layers 20 are made of SiGe and the second semiconductor layers 25 are made of Si. In the lateral etching shown in FIG. 6, instead of the first semiconductor layers 20, the second semiconductor layers 25 are laterally etched, and the inner spacers 35 are formed on the etched end faces of the second semiconductor layers. The base epitaxial layer 49 is made of the same material (SiGe) as the first semiconductor layers 20. In the nanostructures releasing process shown in FIGS. 17A and 17B, instead of the first semiconductor layers 20, the second semiconductor layers 25 are removed, and the gate structures are formed around the first semiconductor layers 20. In some embodiments, the FET shown in FIG. 22B is a p-type FET. In some embodiments, the p-type FET shown in FIG. 22B is formed over the same substrate on which the n-type FET shown in FIG. 18A is formed.

In the embodiments of the present disclosure, a base epitaxial layer 49, which is a non-doped semiconductor layer is first formed in the source/drain space. Since the growth rate of a non-doped Si or SiGe layer is relatively smaller than the growth rate of a doped Si or SiGe layer, it is possible to suppress or avoid formation of a void or a seam in the source/drain epitaxial layer. Further, the non-doped base epitaxial layer can improve a short channel effect. In some embodiments, the epitaxial growth of the base epitaxial layer 49 and the epitaxial growth of the source/drain epitaxial layer 50 or 55 are continuously performed in the same chamber (in-situ deposition) by changing one or more deposition conditions.

It will be understood that not all advantages have been necessarily discussed herein, no particular advantage is required for all embodiments or examples, and other embodiments or examples may offer different advantages.

In accordance with one aspect of the present disclosure, a fin structure, in which first semiconductor layers and second semiconductor layers are alternately stacked, is formed, a sacrificial gate structure is formed over the fin structure, a source/drain region of the fin structure, which is not covered by the sacrificial gate structure, is recessed thereby forming a source/drain space, a base epitaxial layer is formed at a bottom portion of the source/drain space, and a source/drain epitaxial layer is formed on the base epitaxial layer. The base epitaxial layer includes a non-doped semiconductor material. In one or more of the foregoing and following embodiments, the second semiconductor layer and the base epitaxial layer are made of a same semiconductor material. In one or more of the foregoing and following embodiments, the semiconductor device is an n-type field effect transistor (FET), and the non-doped semiconductor material is non-doped Si. In one or more of the foregoing and following embodiments, the semiconductor device is a p-type field effect transistor (FET), and the non-doped semiconductor material is non-doped SiGe. In one or more of the foregoing and following embodiments, the first semiconductor layers are laterally etched through the source/drain space, and an inner spacer made of a dielectric material is formed on an end of each of the etched first semiconductor layers. The base epitaxial layer is formed after the inner spacer is formed. In one or more of the foregoing and following embodiments, the base epitaxial layer is not in contact with the inner spacer. In one or more of the foregoing and following embodiments, the semiconductor device is an n-type field effect transistor (FET). In the formation of the source/drain epitaxial layer, a first epitaxial layer made of SiP is formed on the base epitaxial layer, a second epitaxial layer having a higher P content than the first epitaxial layer is formed on the first epitaxial layer, and a third epitaxial layer having a lower P content than the second epitaxial layer is formed on the second epitaxial layer. In one or more of the foregoing and following embodiments, the semiconductor device is a p-type field effect transistor (FET). In the formation of the source/drain epitaxial layer, a first epitaxial layer made of SiGe is formed on the base epitaxial layer, a second epitaxial layer having a higher Ge content than the first epitaxial layer is formed on the first epitaxial layer, and a third epitaxial layer having a lower Ge content than the second epitaxial layer is formed on the second epitaxial layer. In one or more of the foregoing and following embodiments, the first epitaxial layer includes B, and a B concentration of the first epitaxial layer increases as the first epitaxial layer is grown.

In accordance with another aspect of the present disclosure, in a method of manufacturing a semiconductor device, a fin structure, in which first semiconductor layers and second semiconductor layers are alternately stacked, is formed, a sacrificial gate structure is formed over the fin structure, a source/drain region of the fin structure, which is not covered by the sacrificial gate structure, is etched, thereby forming a source/drain space, the first semiconductor layers are laterally etched through the source/drain space, and an inner spacer made of a dielectric material is formed on an end of each of the etched first semiconductor layers, a base epitaxial layer is formed at a bottom portion of the source/drain space, and a source/drain epitaxial layer is formed on the base epitaxial layer. At least one process selected from the group consisting of a lithography process and an etching process is performed after the base epitaxial layer is formed and before the source/drain epitaxial layer is formed. In one or more of the foregoing and following embodiments, the base epitaxial layer includes a non-doped semiconductor material. In one or more of the foregoing and following embodiments, the second semiconductor layer and the base epitaxial layer are made of a same semiconductor material. In one or more of the foregoing and following embodiments, in the formation of the source/drain epitaxial layer, a first epitaxial layer is formed on the base epitaxial layer, a second epitaxial layer is formed on the first epitaxial layer, and a third epitaxial layer is formed on the second epitaxial layer, and the first to third epitaxial layers are continuously formed in a same chamber by changing one or more deposition conditions. In one or more of the foregoing and following embodiments, the base epitaxial layer is formed by HCl and at least one selected from the group consisting of $SiH_4$, $SiH_2Cl_2$ and $GeH_4$. In one or more of the foregoing and following embodiments, in the formation of the base epitaxial layer, deposition phases and etching phases are alternately performed.

In accordance with another aspect of the present disclosure, in a method of manufacturing a semiconductor device, a first fin structure and a second fin structure are formed, in each of which first semiconductor layers and second semiconductor layers are alternately stacked. A first sacrificial gate structure is formed over the first fin structure and a second sacrificial gate structure is formed over the second fin structure. A first source/drain space is formed by etching a first source/drain region of the first fin structure, which is not covered by the first sacrificial gate structure, and a second source/drain space is formed by etching a second source/drain region of the second fin structure, which is not covered by the second sacrificial gate structure. A first base epitaxial layer is formed at a bottom portion of the first source/drain space and a second base epitaxial layer is formed at a bottom portion of the second source/drain space. The second base epitaxial layer is covered by a first cover layer. A first source/drain epitaxial layer is formed on the first base epitaxial layer, while covering the second base epitaxial layer. The first cover layer is removed. The first source/drain epitaxial layer is covered by a second cover layer. A second source/drain epitaxial layer is formed on the second base epitaxial layer, while covering the first source/drain epitaxial layer. In one or more of the foregoing and following embodiments, the first and second base epitaxial layers includes a non-doped semiconductor material. In one or more of the foregoing and following embodiments, the second semiconductor layer and the first and second base epitaxial layers are made of a same semiconductor material. In one or more of the foregoing and following embodiments, in the formation of the first source/drain epitaxial layer, a first epitaxial layer is formed on the first base epitaxial layer, a second epitaxial layer is formed on the first epitaxial layer, and a third epitaxial layer is formed on the second epitaxial layer, and the first to third epitaxial layers are continuously formed in a same chamber by changing one or more deposition conditions. In one or more of the foregoing and following embodiments, the base epitaxial layer and the first epitaxial layer is doped with P or B, and a dopant amount of the base epitaxial layer is $1/100$ to $1/10$ of a dopant amount of the first epitaxial layer.

In accordance with another aspect of the present disclosure, a semiconductor device includes semiconductor nanostructures disposed over a substrate, a source/drain epitaxial layer in contact with the semiconductor nanostructures, a gate dielectric layer disposed on and wrapping around each channel region of the semiconductor nanostructures, a gate electrode layer disposed on the gate dielectric layer and wrapping around each channel region, and insulating spacers disposed in spaces, respectively, the spaces being defined by adjacent semiconductor nanostructures, the gate electrode layer and the source/drain region. The source/drain epitaxial layer includes a non-doped base epitaxial layer and multiple epitaxial semiconductor layers having different compositions from each other formed on the base epitaxial layer. In one or more of the foregoing and following embodiments, the multiple epitaxial semiconductor layers are SiGe layers having different Ge contents from each other. In one or more of the foregoing and following embodiments, a Ge content of at least one of the SiGe layers increases along a growth direction of the SiGe layers. In one or more of the foregoing and following embodiments, at least one of the SiGe layers includes B, and a B content of the at least one of the multiple SiGe layers increases along a growth direction of the at least one of the SiGe layers. In one or more of the foregoing and following embodiments, the base epitaxial layer and the semiconductor nanostructures are made of a same material. In one or more of the foregoing and following embodiments, the multiple epitaxial semiconductor layers are SiP layers having different P contents from each other. In one or more of the foregoing and following embodiments, a P content of at least one of the SiP layers increases along a growth direction of the SiP layers.

In accordance with another aspect of the present disclosure, a semiconductor device includes semiconductor nanostructures disposed over a substrate, a source/drain epitaxial layer in contact with the semiconductor nanostructures, a gate dielectric layer disposed on and wrapping around each channel region of the semiconductor nanostructures, a gate electrode layer disposed on the gate dielectric layer and wrapping around each channel region, and insulating spacers disposed in spaces, respectively, the spaces being defined by adjacent semiconductor nanostructures, the gate electrode layer and the source/drain region. The source/drain epitaxial layer includes a non-doped base epitaxial layer which is not in contact with a bottommost one of the insulating spacers and a first epitaxial semiconductor layer formed on the base epitaxial layer. In one or more of the foregoing and following embodiments, the first epitaxial layer is in contact with semiconductor nanostructures and the insulating spacers. In one or more of the foregoing and following embodiments, the source/drain epitaxial layer further includes a second epitaxial layer having a different composition than the first epitaxial layer and formed on the first epitaxial layer and a third epitaxial layer having a different composition than the second epitaxial layer and formed on the second epitaxial layer. In one or more of the foregoing and following embodiments, the second epitaxial layer is not in contact with the semiconductor nanostructures and the base epitaxial layer. In one or more of the foregoing and following embodiments, the third epitaxial layer is not in contact with the first epitaxial layer. In one or more of the foregoing and following embodiments, the second epitaxial layer is not in contact with semiconductor nanostructures and the base epitaxial layer. In one or more of the foregoing and following embodiments, the base epitaxial layer and the semiconductor wires or sheets are made of a same material. In one or more of the foregoing and following embodiments, the same material is Si. In one or more of the foregoing and following embodiments, the same material is SiGe. In one or more of the foregoing and following embodiments, a bottom of the base epitaxial layer has a V-shape or a U-shape.

In accordance with another aspect of the present disclosure, a semiconductor device includes an n-type field effect transistor (FET), and a p-type FET. Each of the n-type FET and the p-type FET includes semiconductor nanostructures disposed over a substrate, a source/drain epitaxial layer in contact with the semiconductor nanostructures, a gate dielectric layer disposed on and wrapping around each channel region of the semiconductor nanostructures, a gate electrode layer disposed on the gate dielectric layer and wrapping around each channel region, and insulating spacers disposed in spaces, respectively, the spaces being defined by adjacent semiconductor nanostructures, the gate electrode layer and the source/drain region. The source/drain epitaxial layer includes a non-doped base epitaxial layer, the source/drain epitaxial layer of the n-type FET includes multiple SiP layers having different P contents and formed on the non-doped base epitaxial layer, and the source/drain epitaxial layer of the p-type FET includes multiple SiGe layers having different Ge contents and formed on the non-doped base epitaxial layer. In one or more of the foregoing and following embodiments, the base epitaxial layer and the semiconductor nanostructures are made of a same material. In one or more of the foregoing and following embodiments, the non-doped base epitaxial layer is not in contact with a bottommost one of the insulating spacers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first fin structure and a second fin structure, in each of which first semiconductor layers and second semiconductor layers are alternately stacked;
    forming a first sacrificial gate structure over the first fin structure and a second sacrificial gate structure over the second fin structure;
    forming a first source/drain space by etching a first source/drain region of the first fin structure, which is not covered by the first sacrificial gate structure, and forming a second source/drain space by etching a second source/drain region of the second fin structure, which is not covered by the second sacrificial gate structure;
    forming a first base epitaxial layer at a bottom portion of the first source/drain space and forming a second base epitaxial layer at a bottom portion of the second source/drain space;
    covering the second base epitaxial layer by a first cover layer;
    forming a first source/drain epitaxial layer on the first base epitaxial layer, while covering the second base epitaxial layer;
    removing the first cover layer;
    covering the first source/drain epitaxial layer by a second cover layer; and
    forming a second source/drain epitaxial layer on the second base epitaxial layer, while covering the first source/drain epitaxial layer.

2. The method of claim 1, wherein the first and second base epitaxial layers include a non-doped semiconductor material.

3. The method of claim 2, wherein the second semiconductor layers and the first and second base epitaxial layers are made of a same semiconductor material.

4. The method of claim 1, wherein:
    the forming the first source/drain epitaxial layer comprises:
        forming a first epitaxial layer on the first base epitaxial layer;
        forming a second epitaxial layer on the first epitaxial layer; and
        forming a third epitaxial layer on the second epitaxial layer, and
    the first to third epitaxial layers are continuously formed in a same chamber by changing one or more deposition conditions.

5. The method of claim 4, wherein the first base epitaxial layer and the first epitaxial layer is doped with P or B, and a dopant amount of the first base epitaxial layer is $1/100$ to $1/10$ of a dopant amount of the first epitaxial layer.

6. A semiconductor device comprising:
    semiconductor wires or sheets disposed over a substrate;
    a source/drain epitaxial layer in contact with the semiconductor wires or sheets;
    a gate dielectric layer disposed on and wrapping around each channel region of the semiconductor wires or sheets;
    a gate electrode layer disposed on the gate dielectric layer and wrapping around each channel region; and
    insulating spacers disposed in spaces, respectively, the spaces being defined by adjacent semiconductor wires or sheets, the gate electrode layer and the source/drain epitaxial layer,
    wherein the source/drain epitaxial layer includes a non-doped base epitaxial layer which is not in contact with a bottommost one of the insulating spacers and a first epitaxial semiconductor layer formed on the base epitaxial layer.

7. The semiconductor device of claim 6, wherein the first epitaxial layer is in contact with semiconductor wires or sheets and the insulating spacers.

8. The semiconductor device of claim 6, wherein the source/drain epitaxial layer further includes a second epitaxial layer having a different composition than the first epitaxial layer and formed on the first epitaxial layer and a third epitaxial layer having a different composition than the second epitaxial layer and formed on the second epitaxial layer.

9. The semiconductor device of claim 8, wherein the second epitaxial layer is not in contact with the semiconductor wires or sheets and the non-doped base epitaxial layer.

10. The semiconductor device of claim 8, wherein the third epitaxial layer is not in contact with the first epitaxial layer.

11. The semiconductor device of claim 8, wherein the second epitaxial layer is not in contact with semiconductor wires or sheets and the non-doped base epitaxial layer.

12. The semiconductor device of claim 6, wherein the non-doped base epitaxial layer and the semiconductor wires or sheets are made of a same material.

13. The semiconductor device of claim 12, wherein the same material is Si.

14. The semiconductor device of claim 12, wherein the same material is SiGe.

15. The semiconductor device of claim 6, wherein a bottom of the non-doped base epitaxial layer has a V-shape or a U-shape.

16. A semiconductor device comprising:
    an n-type field effect transistor (FET); and
    a p-type FET, wherein:
    each of the n-type FET and the p-type FET comprises:
        semiconductor wires or sheets disposed over a substrate;
        a source/drain epitaxial layer in contact with the semiconductor wires or sheets;
        a gate dielectric layer disposed on and wrapping around each channel region of the semiconductor wires or sheets;
        a gate electrode layer disposed on the gate dielectric layer and wrapping around each channel region; and
        insulating spacers disposed in spaces, respectively, the spaces being defined by adjacent semiconductor wires or sheets, the gate electrode layer and the source/drain epitaxial layer,
    the source/drain epitaxial layer includes a non-doped base epitaxial layer, wherein the non-doped base epitaxial layer is not in contact with a bottommost one of the insulating spacers, the source/drain epitaxial layer of the n-type FET includes multiple SiP layers having different P contents and formed on the non-doped base epitaxial layer, and the source/drain epitaxial layer of the p-type FET includes multiple SiGe layers having different Ge contents and formed on the non-doped base epitaxial layer.

17. The semiconductor device of claim 16, wherein the non-doped base epitaxial layer and the semiconductor wires or sheets are made of a same material.

18. The semiconductor device of claim 16, wherein the multiple SiP layers include a first epitaxial layer, a second epitaxial layer having a higher P content than the first epitaxial layer on the first epitaxial layer and a third epitaxial layer having a lower P content than the second epitaxial layer on the second epitaxial layer.

19. The semiconductor device of claim 16, wherein the multiple SiGe layers include a first SiGe layer on the non-doped base epitaxial layer, a second SiGe layer having a higher Ge content than the first SiGe layer on the first SiGe layer, and a third SiGe layer having a lower Ge content than the second SiGe layer on the second SiGe layer.

20. The semiconductor device of claim 16, wherein a bottom of the non-doped base epitaxial layer has a V-shape or a U-shape.

* * * * *